United States Patent
Rada

(10) Patent No.: US 10,225,120 B2
(45) Date of Patent: Mar. 5, 2019

(54) BPSK DEMODULATION

(71) Applicant: Keyssa Systems, Inc., Campbell, CA (US)

(72) Inventor: Patrick Antoine Rada, San Diego, CA (US)

(73) Assignee: Keyssa Systems, Inc., Campbell, CA (US)

(*) Notice: Subject to any disclaimer, the term of this patent is extended or adjusted under 35 U.S.C. 154(b) by 0 days.

(21) Appl. No.: 15/865,069

(22) Filed: Jan. 8, 2018

(65) Prior Publication Data

US 2018/0131546 A1 May 10, 2018

Related U.S. Application Data

(63) Continuation of application No. 15/284,386, filed on Oct. 3, 2016, now Pat. No. 9,900,197.

(51) Int. Cl.
| | |
|---|---|
| *H04L 27/233* | (2006.01) |
| *H04L 7/00* | (2006.01) |
| *H04L 27/22* | (2006.01) |
| *H04L 27/34* | (2006.01) |
| *H04L 27/18* | (2006.01) |

(52) U.S. Cl.
CPC ........ *H04L 27/2334* (2013.01); *H04L 7/0041* (2013.01); *H04L 27/22* (2013.01); *H04L 27/34* (2013.01); *H04L 27/18* (2013.01)

(58) Field of Classification Search
CPC ......... H04L 27/32; H04L 27/34; H04L 27/18; H04L 27/22; H04L 27/2334
See application file for complete search history.

(56) References Cited

U.S. PATENT DOCUMENTS

| | | | |
|---|---|---|---|
| 9,197,283 B1 | 11/2015 | Nguyen | |
| 9,426,842 B2 * | 8/2016 | Koppelaar | .......... H04W 88/085 |
| 9,900,197 B1 | 2/2018 | Rada et al. | |
| 2008/0159370 A1 | 7/2008 | Atherton | |
| 2009/0017782 A1 | 1/2009 | Monat | |
| 2014/0161211 A1 | 6/2014 | Tsai | |
| 2017/0149411 A1 | 5/2017 | Nielsen | |

* cited by examiner

*Primary Examiner* — Jean B Corrielus
(74) *Attorney, Agent, or Firm* — Fish & Richardson P.C.

(57) ABSTRACT

Methods, systems, and apparatus for EM communications. One of the apparatus includes a super-regenerative amplifier (SRA) configured to receive a binary phase shift keying (BPSK) modulated signal and to output an amplitude signal as a function of changes in phase in the BPSK modulated signal; a pseudo synchronous demodulator that rectifies the amplitude signal and generates an envelope of the rectified amplitude signal; and an analog to digital converter that converts the amplitude values of the envelope to digital binary values.

20 Claims, 17 Drawing Sheets

BPSK DEMODULATION

BACKGROUND

This specification relates to electromagnetic communications.

Advances in semiconductor manufacturing and circuit design technologies have enabled the development and production of integrated circuits (ICs) with increasingly higher operational frequencies. In turn, electronic products and systems incorporating high frequency integrated circuits are able to provide greater functionality than previous generations of products. The additional functionality has typically included the processing of increasingly larger amounts of data at increasingly higher speeds.

Conventional contactless communications use a carrier signal to transmit information through space as an electromagnetic wave. The carrier signal is typically modulated with an input signal to carry information. A carrier signal can be modulated in a number of ways. In digital modulation, an analog carrier signal is conventionally modulated by a discrete signal.

One conventional modulation technique includes modulating the phase of the carrier signal. Phase-shift keying (PSK) is a digital modulation that uses a finite number of phases, each assigned a unique pattern of binary digits of the input signal. Typically, each phase encodes an equal number of bits. Each pattern of bits forms a symbol that is represented by the particular phase.

The simplest form of PSK is binary PSK where the phase change can be either 0 or 180 degrees. That can be mapped to a binary sequence where for instance a "1" corresponds to a 180-degree phase shift while a "0" to 0 degree or no phase shift.

To recover the information at a receiver, a demodulator is used to extract the input signal from the modulated carrier signal. PSK demodulation determines the phase of the received signal and maps it back to the symbol it represents to recover the original information. Conventional PSK demodulation requires the receiver to be able to compare the phase of the received signal to a reference signal synchronous with the carrier signal.

SUMMARY

In general, one innovative aspect of the subject matter described in this specification can be embodied in apparatuses that include a super-regenerative amplifier (SRA) configured to receive a binary phase shift keying (BPSK) modulated signal and to output an amplitude signal as a function of changes in phase in the BPSK modulated signal; a pseudo synchronous demodulator that rectifies the amplitude signal and generates an envelope of the rectified amplitude signal; and an analog to digital converter that converts the amplitude values of the envelope to digital binary values.

The foregoing and other embodiments can each optionally include one or more of the following features, alone or in combination. In particular, one embodiment includes all the following features in combination. The apparatus further includes: a low pass filter coupled between the pseudo synchronous demodulator and the analog to digital converter. The SRA amplifies the BPSK modulated signal to a maximum amplitude when no phase change occurs. The SRA amplification approaches zero amplitude when a phase change occurs. The analog to digital converter compares amplitude values to a threshold such that amplitude values above the threshold are assigned a first digital binary value and amplitude values below the threshold are assigned a second digital binary value. The amplitude during a particular operation refers to one or more of voltage, current, power, frequency, phase, or temperature. The apparatus further includes: an antenna for receiving the BPSK modulated signal from a transmitting device. The apparatus further includes: a waveguide launcher configured to receive the BPSK modulated signal from a transmitting device.

The apparatus further includes: a modulation portion for modulating an input digital data for transmission, wherein the modulation porting includes: a digital to analog converter configured to key binary values of the digital data to analog symbols; and a BPSK modulator configured to modulate the phase of a carrier signal generated by an oscillator based on the binary value associated with each symbol. The SRA includes an amplifier, a delay line, an adder, and a reset switch positioned in a direct path from the amplifier to an output of the SRA. The SRA includes an amplifier, a delay line, an adder, and a reset switch positioned in a delay path between the delay line and the adder. The SRA includes an adder, an amplifier, a reset switch positioned in a direct path from the amplifier to an output of the SRA, and a delay loop, wherein the delay loop includes a delay line and an inverter. The inverter provides a gain of −1 and the delay line provides a delay of 180 degrees. The SRA includes an adder, an amplifier, and a delay loop, wherein the delay loop includes an inverter, a delay line, and a reset switch. The inverter provides a gain of −1 and the delay line provides a delay of 180 degrees. The SRA includes an amplifier delay line, a reset switch, and a subtractor, wherein the delay line provides a 180-degree delay. The SRA includes an oscillator amplifier.

The SRA is a single ended amplifier, the SRA including at least one fixed or virtual delay line, an oscillator amplifier, an adder, and a resonator circuit. The SRA is differential, the SRA including a pair of fixed or virtual delay lines, an oscillator amplifier, a pair of adders, and a resonator circuit, and wherein the SRA generates a differential phase to amplitude conversion. The apparatus further includes: a second SRA, wherein the SRA and the second SRA are interleaved. Each SRA is configured to regenerate over a double symbol length of time and wherein each SRA has a half symbol rate interleaved timing. The second SRA's reset signal is delayed by one symbol versus the first SRA's reset signal. The SRA includes an oscillator amplifier topology. The SRA provides a linear phase to amplitude conversion. The SRA provides a loop gain for each cycle of 1. The SRA provides a non-linear phase to amplitude conversion. The SRA includes a reset switch that is triggered by a cyclical reset signal. The reset signal is synchronized in phase with incoming symbols. The reset signal is synchronized in phase with the incoming symbols but delayed by a fixed amount relative to the symbols. The reset signal is synchronized in phase with the incoming symbols and wherein there are multiple reset cycles per symbol according to a fixed delay amount relative to the symbols. The reset signal is triggered in response to a threshold amplitude of the amplified signal. The SRA is preceded by an automatic gain control (AGC); and the SRA is made synchronous with the incoming symbol rate with a synchronization mechanism, the synchronization mechanism controlling the AGC in a manner to accelerate or decelerate the SRA's speed of regeneration by changing the amplitude of the SRA input.

In general, one innovative aspect of the subject matter described in this specification can be embodied in apparatuses that include a super-regenerative amplifier (SRA)

configured to receive a binary phase shift keyed (BPSK) modulated signal and to output a amplitude signal as a function of changes in phase in the BPSK modulated signal; a pseudo synchronous demodulator that rectifies the amplitude signal and generates an envelope of the rectified amplitude signal; and a comparator that compares the amplitude values of the rectified amplitude signal with a reference amplitude to generate a binary digital output signal.

In general, one innovative aspect of the subject matter described in this specification can be embodied in methods that include the actions of receiving a binary phase shift keying (BPSK) modulated signal; using one or more super-regenerative amplifier (SRA) to convert the phase of the BPSK modulated signal to amplitude values; and performing pseudo synchronous demodulation to process the amplitude values into an envelope of the rectified amplitude signal.

The method further includes converting the envelope of the rectified amplitude signal into a binary bit stream. Converting the envelope of the rectified amplitude signal into a binary bit stream includes performing analog to digital conversion. Converting the envelope of the rectified amplitude signal into a binary bit stream includes passing the signal through a comparator that compares the amplitude values of the envelope rectified amplitude signal with a reference amplitude to generate a binary digital output. The one or more SRAs are configured to perform a specified number of reset cycles across at least one symbol length of the input signal prior to a reset signal being triggered. The one or more SRAs each amplifies the input signal when no phase change occurs. The one or more SRAs each de-amplifies the input signal by the reset signal when there is a 180-degree phase change. The one or more SRAs are configured to provide a linear gain. The number of amplification cycles performed by each SRA depends on the SRA topology. At least one reset cycle's regeneration amongst a plurality of reset cycle's regenerations is affected by a change of phase between one incoming BPSK symbol and the next; wherein the envelope of the rectified amplitude signal for this one reset cycle's regeneration is lower in comparison to at least one other reset cycle's regeneration; and wherein the difference can be processed as a change of phase.

The subject matter described in this specification can be implemented in particular embodiments so as to realize one or more of the following advantages. Demodulation using a super regenerative amplifier configured as a phase to voltage converter can simplify the demodulation by reducing the components needed as compared to conventional BPSK demodulation. For example, a frequency/phase carrier extraction circuit is not needed to determine phase changes. In other words, a typical requirement of synchronous demodulation, e.g., using a local oscillator, PLL, or Costas loop is avoided. This can reduce the size and complexity, as well as power consumption, of receivers. Demodulation using the super regenerative amplifier increases the gain of the received transmission which can reduce the transmit power needed. Furthermore, the use of the super regenerative amplifier can reduce noise relative to the data signal since the noise will generally be averaged by the amplifier since it is not coherent with the signal.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like reference symbols in the various drawings indicate like elements.

DETAILED DESCRIPTION

Overview

This specification describes techniques for demodulating a modulated carrier signal. In particular, this specification describes demodulation of a carrier signal modulated using binary phase-shift keying (BPSK) modulation. BPSK uses two phases which are separated by 180 degrees, e.g., 0 degrees and 180 degrees. This specification describes a configuration of a phase demodulator and a super-regenerative amplifier (SRA) that is used for demodulation such that the need for a local oscillator that is generally synchronized with the use of a Costas loop to provide synchronicity with the input carrier signal is eliminated. This SRA generates a voltage output representative of phase changes in the BPSK modulated signal. In some implementations, a comparator can be used in place of an analog to digital converter to determine a bit stream from voltage values.

Contactless Communication

Contactless communication may be used to provide signal communications between components on a device or may provide communication between devices. In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may not be contiguous with respect to each other. In some examples, the transmitter and receiver may be disposed on separate circuit carriers positioned with transducers (e.g., one or more antennas) of the transmitter/receiver pair in close proximity.

Figure 1:
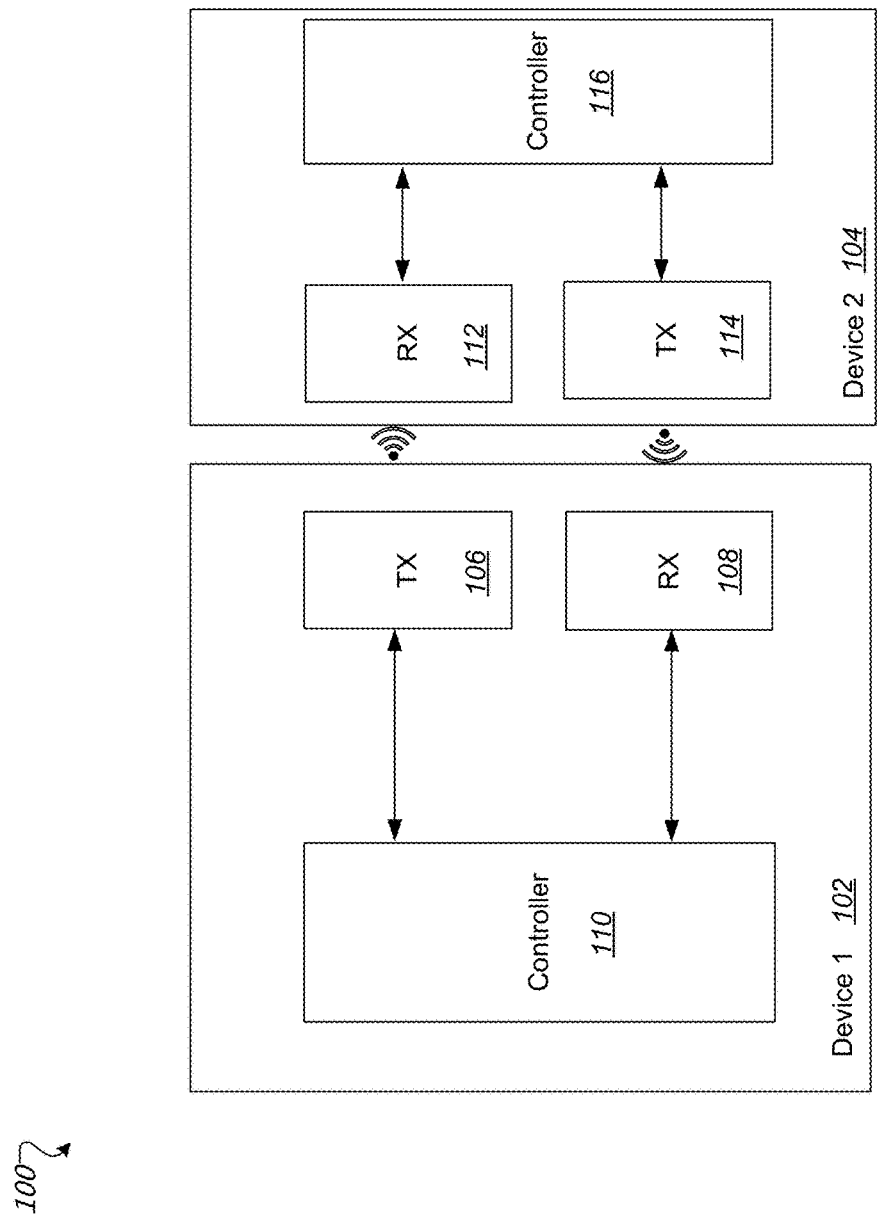
FIG. 1 is a block diagram of an example contactless communication between two devices.

FIG. 1 is a block diagram 100 of an example contactless communication between two devices. A first device 102 includes a transmitter 106 and a receiver 108. In particular, the transmitter 106 and receiver 108 can each be transceivers capable of operating in either a transmitter or receiver mode. The transmitter 106 and the receiver 108 are each communicatively coupled to a controller 110 that manages transmission or receipt of data by the first device 102.

The second device 104 includes a transmitter 114 and a receiver 112. In particular, the transmitter 114 and receiver 112 can each be transceivers capable of operating in either a transmitter or receiver mode. The transmitter 114 and the receiver 112 are each communicatively coupled to a controller 116 that manages transmission or receipt of data by the second device 104.

As shown in FIG. 1, both the first device 102 and the second device 104 have respective transmitters and receivers. This allows for dual communication links for transmitting data between the first device 102 and the second device 104. In particular, a first contactless communication link can be formed between the transmitter 106 of the first device 102 and the receiver 112 of the second device 104. A second contactless communication link can be formed between the transmitter 114 of the second device and the receiver 108 of the first device 102.

Figure 2:
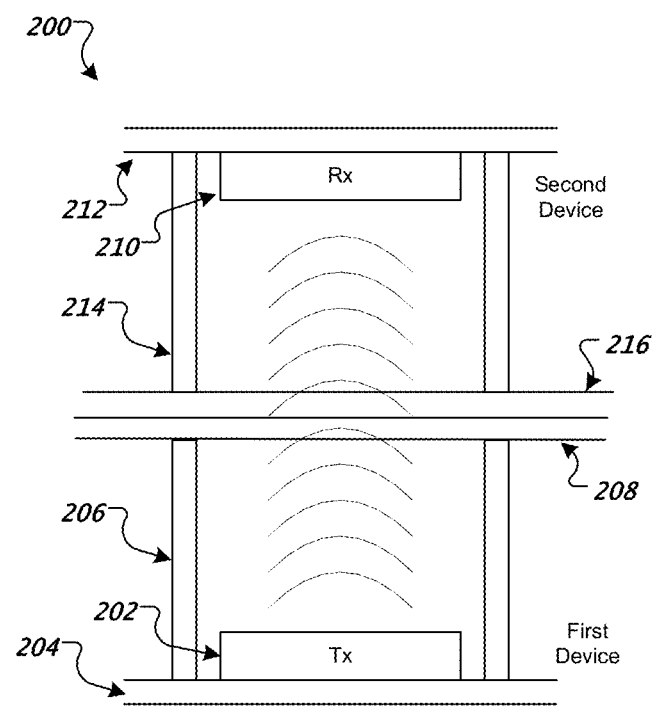
FIG. 2 is a side view diagram of an example communication between communication modules.

FIG. 2 is a side view diagram 200 of an example communication between communication modules. FIG. 2 illustrates communication between a transmitter and a receiver. For example, a user of a first device may wish to exchange data with a second device. In some implementations, communication can flow in the opposite direction from the second device to the first device by switching the transmitter of the first device to a receiver and the receiver of the second device to a transmitter. Alternatively, in some other implementations, each device can have more than one transceiver that can act as a transmitter or receiver to establish multiple communication links between the two devices.

The two devices can be positioned in proximity to each other such that the respective communication modules for transmitting and receiving data are aligned and in range of each other. In particular, for EHF frequencies, the transmitter and receiver of the two devices may need to be within specified distances. The distances can vary, for example, depending on the particular frequencies used, the materials between the transmitter and receiver, and the strength of the transmission.

In FIG. 2, a first device includes a first communication module having a transceiver IC package 202 operating as a transmitter and positioned on a first PCB 204. The transceiver IC package 202 is surrounded by a first signal guiding structure 206 forming a channel. The first signal guiding structure 206 extends to a surface of a first housing 208 of the first device. For example, the first device can be a first mobile phone and the first housing 208 can correspond to the outer case of the first mobile phone.

A second device includes a second communication module having a transceiver IC package 210 operating as a receiver and positioned on a second PCB 212. The transceiver IC package 210 is surrounded by a second signal guiding structure 214 forming a channel. The second signal guiding structure 214 extends to a surface of a second housing 216 of the second device. For example, the second device can be a second mobile phone and the second housing 216 can correspond to the outer case of the second mobile phone. The signal guiding structures can be formed of metallic or metallic lined walls that surround the IC package 210.

As illustrated by diagram 200, the first signal guiding structure 206 and the second signal guiding structure 214 are aligned and an outer surface of the first housing 208 and the second housing 216 are in physical contact to provide optimal communication distance and interference.

A data transmission from the transceiver IC package 202, e.g., from an antenna of the IC package, passes through the channel formed by the first signal guiding structure 206 and the second signal guiding structure 214 to the transceiver IC package 210, e.g., received by an antenna of the IC package. For example, a pair of devices can communicate data between each other by transmitting data from the transceiver IC package 202 to the transceiver IC package 210. The signal guiding structures along with proper alignment can maximize the power of the transmission that is received by the receiver IC package. In some implementations, the signal guiding structures can be formed from, or include a layer of, a metallic material that reflects the transmitted data along the signal guiding structures toward the receiver. In some other implementations, the signal guiding structures can be formed from, or include a layer of, an electromagnetic absorbing material to reduce stray signals that may cause interference.

Although the example of EHF contactless communication is used throughout, the BPSK demodulation configurations described in this specification can be used for any suitable wireless communication in which information is encoded for communication in a modulated carrier signal. For example, the demodulation can be used with a wide spectrum of frequencies from very low frequencies, e.g., a few kilohertz to very high frequencies, e.g., 1000 GHz. Similarly, the demodulation can be used for various wireless applications including, for example, FM radio, e.g., at 100 megahertz (MHz), long range digital radio, e.g., at 150 MHz, medical communication, e.g., at 433 MHz, ISM apps, e.g., at 900 MHz, 2.4-2.5 GHz, 5-6 GHz, 57-64 GHz, etc. The demodulation configurations can also be used for different communication protocols such as Bluetooth, BLE, LTE, CDMA, Wi-Fi, etc.

Typical PSK Communications

Figure 3:
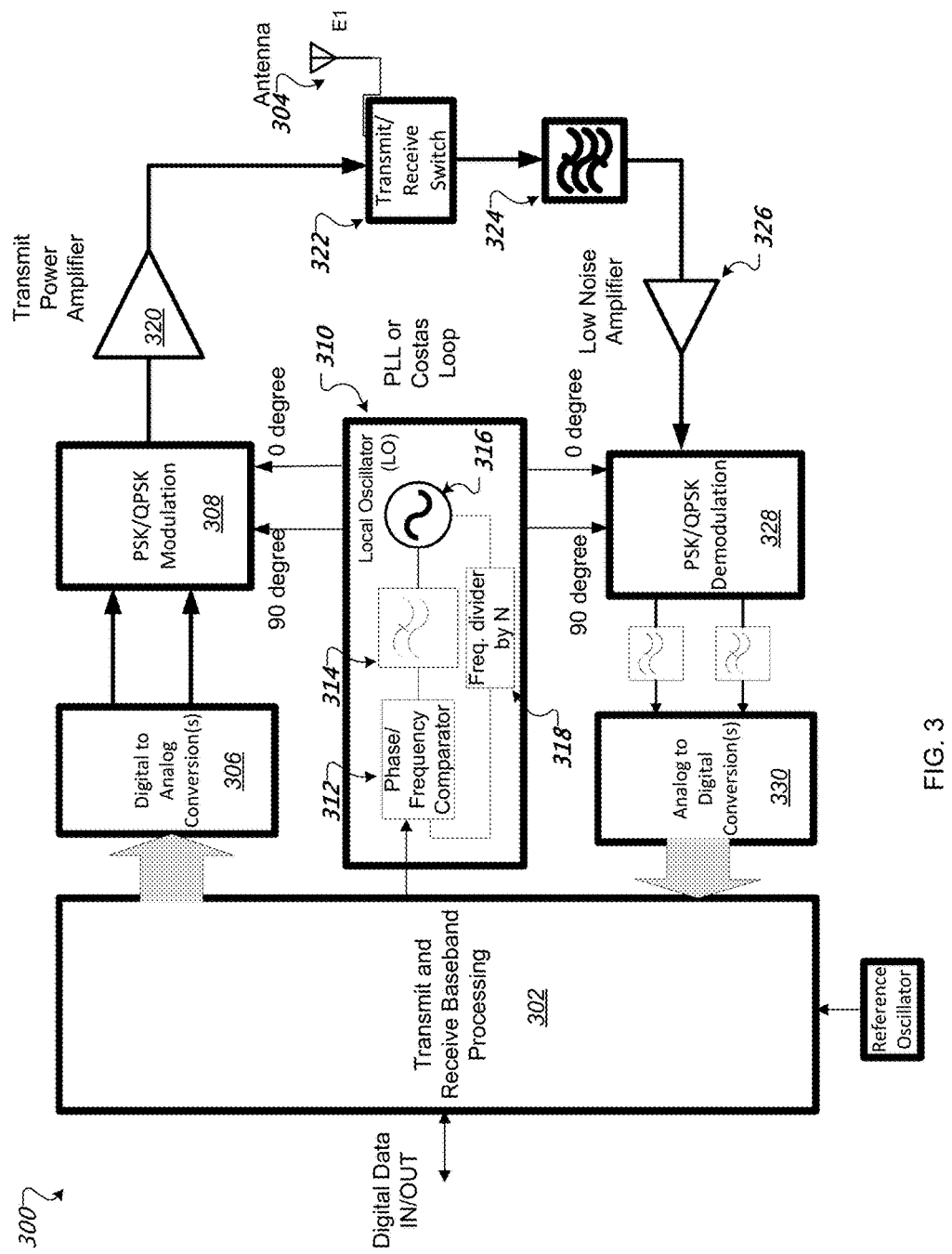
FIG. 3 is a block diagram of an example communication system including demodulation.

FIG. 3 is a block diagram of an example communication system 300 including demodulation. In particular, communication system 300 includes both modulation and demodulation paths for data transmission and data reception, respectively. For example, for a transceiver used to both transmit and receive data depending on the set mode for the transceiver. A single structure is shown for convenience, however, in some other implementations, the paths can be independent and associated with distinct antennas, e.g., of different IC packages, without changing the general functioning of the modulation and demodulation.

To transmit modulated data, incoming digital data can be initially received by transmit and receive baseband processing 302, which manages RF functions for the communication system 300. The baseband processing can include performing synchronization, tracking, digital processing, and encoding (alternatively decoding of received data) of an unmodulated digital signal containing information to be transmitted (or that is received). After processing, the data is then passed along a modulation path toward an antenna 304. The antenna 304 then transmits the modulated signal, e.g., toward a receiver of another device.

The modulation path includes a digital to analog converter 306. The digital to analog converter 306 converts the digital data to waveform symbols each representing an integer number of bits. Therefore, each symbol represents a message consisting of N bits.

The PSK modulator 308 applies the symbols to a carrier signal. PSK modulation modulates the phase of the carrier signal by varying the sine and cosine inputs at a precise time. Thus, the modulated phases are used to represent corresponding digital states. Each digital modulation scheme uses a finite number of distinct signals to represent digital data. PSK uses a finite number of phases, each assigned a corresponding digital state with a unique pattern of binary digits. Usually, each phase encodes an equal number of bits. Each pattern of bits forms the symbol that is represented by the particular phase.

The carrier signal with different phases is generated by a phase locked loop (PLL) 310. The PLL 310 shown in FIG. 3 includes a phase/frequency comparator 312, a filter 314, a local oscillator 316, and a frequency divider 318. The phase/frequency comparator 312 has as input a reference input and feedback from the local oscillator 316. The phase/frequency comparator generates a voltage that represents the phase/frequency difference between the two signals. The voltage output is used to control the local oscillator 316 such that the phase difference is held constant. The filter 314 provides stability for the PLL 310. The local oscillator 316 generates a periodic oscillating electronic signal. In this case, the generated signal is used as the carrier signal. The frequency divider 318 is part of a feedback path to the phase/frequency comparator 312. The frequency divider 318 can be used to generate a range of frequencies from the oscillator.

The resulting PSK modulated signal is amplified by a radio frequency amplifier 320 to a specified transmit power and routed to the antenna 304 for transmission. A transmit/receive switch 322 can be used to selectively open the path to the antenna from the transmission path or to open the path for received data signals from the antenna 304. In some implementations, the transmit/receive switch 322 is not needed because the transmission of modulated data and the reception of modulated data are associated with dedicated antennas rather than shared or if the transceiver is full duplex and permits simultaneous transmit and receive modes.

In yet another implementation, the transmitter and receiver are not used simultaneously (half duplex mode) and the transmit power amplifier can be switched off when the receiver receives from the antenna and vice and versa.

When the antenna 304 receives a modulated signal from another device, the transmit/receive switch 322 routes the signal along a demodulation path to extract the analog/digital data from the carrier signal. A band pass filter 324 can be used to filter any signals outside of the particular expected frequencies of the received signal (channel bandwidth). A low noise amplifier 326 can then be used to increase the gain of the received modulated signal.

The PSK demodulator 328 is used to separate the symbols encoding data from the carrier signal. The PSK demodulation can use the PLL 310 to identify the phase changes used to encode each symbol in the carrier signal. In particular, reception demodulation is synchronous. This means that the frequency and phase of the local oscillator must be substantially identical to the incoming carrier frequency and phase to perform demodulation.

To provide the synchronization, the local oscillator has to be placed in phase with the incoming signal. This is referred to as carrier frequency/phase synchronization. The carrier frequency/phase synchronization can be provided by a circuit referred to as a Costas loop. The Costas loop may be partly analog and digital.

Figure 4:
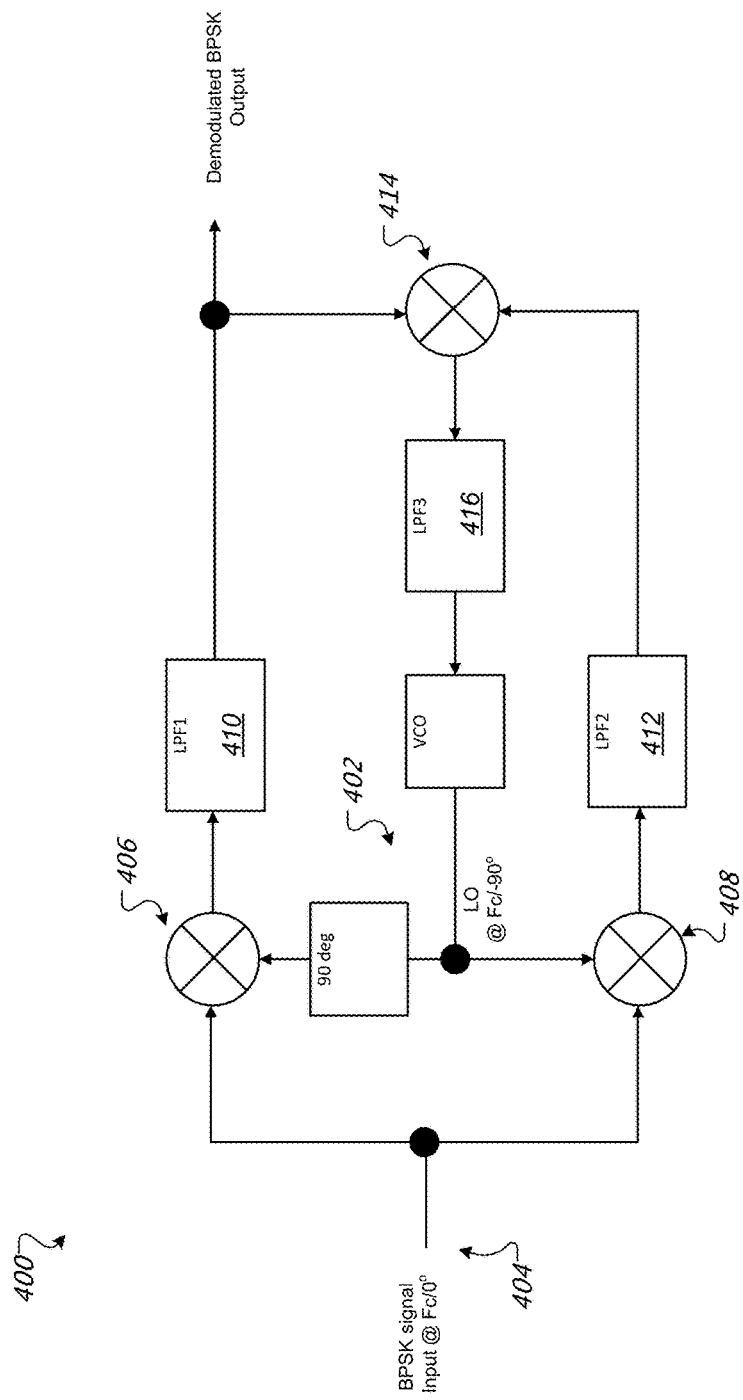
FIG. 4 is a block diagram of an example Costas loop.

FIG. 4 shows a block diagram of an example Costas loop 400 for BPSK demodulation. The Costas loop 400 creates an error signal that is independent of the data rate and grows as twice the phase difference between the local oscillator 402 and the incoming signal 404. The Costas loop 400 uses most of blocks 328 and 318 present in FIG. 3 with an additional a multiplier similar to comparator 312 that creates the error signal steering the local oscillator 316 and provides this synchronous information to perform the demodulation.

In particular, as shown in FIG. 4, the local oscillator 402 is used to generate two outputs having 90-degree phase differences. The two signals are mixed by respective mixers, or phase detectors, 406, 408 with the input signal. The output of the mixers contain the difference in phase between the corresponding oscillator signal and the input signal. The output of each mixer 406, 408 is passed through respective low pass filters 410, 412 to respectively filter the high frequency components while maintaining the phase/frequency error of the modulated signal. The output of each low pass filter is provided to a third mixer 414, which combines the output of the two low pass filters 410 and 412 and removes the data modulation for the inner loop by self-multiplication. The output of the third mixer 414 passes through a third low-pass filter 416 that determines the stability and bandwidth of the overall Costa's loop. The local oscillator 402 is controlled by the input signal to minimize the error signal such that the phase of the local oscillator is synchronized with the phase of the input signal. The demodulated signal is available at the output of the low pass filter 410 as a positive amplitude voltage for a bit "1" for instance and a negative amplitude voltage for a bit "0".

Figure 5:
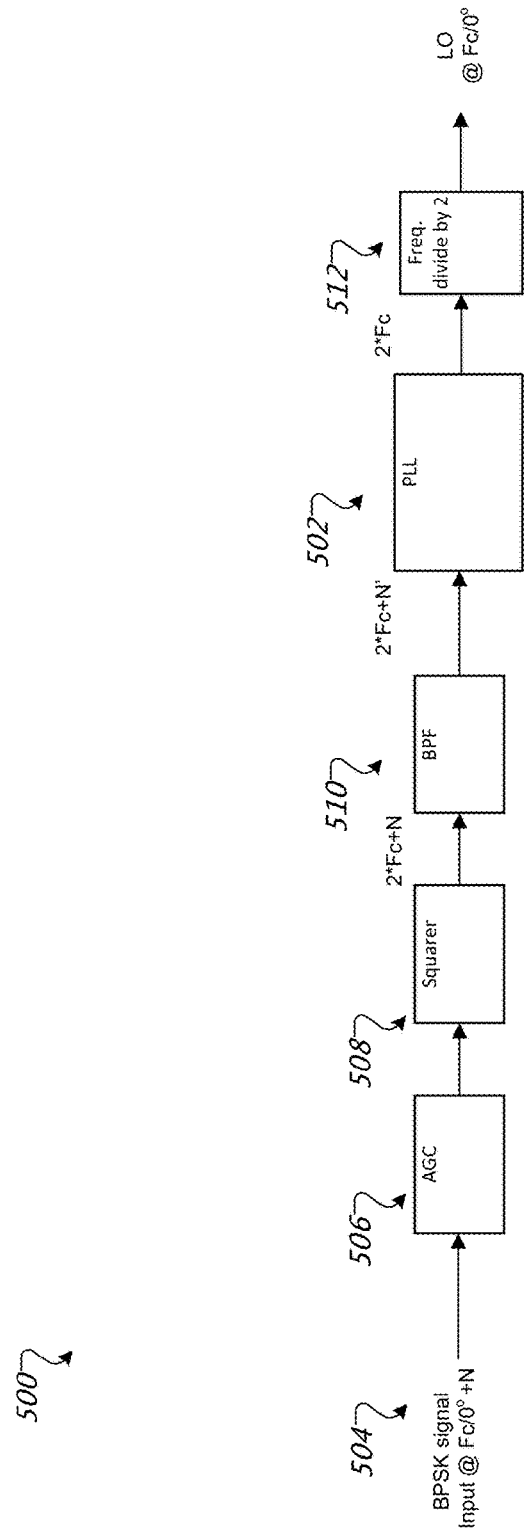
FIG. 5 is a block diagram of an example carrier extraction circuit.

FIG. 5 shows a block diagram of an example carrier extraction circuit 500. The carrier extraction circuit can be used to create a local oscillator signal that is synchronous with the phase and frequency of an incoming modulated signal. The carrier extraction circuit 500 includes a PLL 502 that has a range of capture exceeding the maximum frequency range of the incoming signal carrier frequency including transmitter frequency initial frequency offset (inaccuracy) and various frequency drifts for instance with temperature.

An input signal 504, which may include some noise component, is first passed through an automatic gain control amplifier (AGC) 506 that amplifies and maintains its output to a constant envelope level in range for the carrier extraction circuit with an automatic gain control function or with a limiter. A high gain amplification may be needed depending on various factors including the strength of the input signal, an amount of input noise, and the dynamic range of the input signal. The AGC 506 is followed by a squarer 508 that rectifies the signal envelope and incidentally has the effect of multiplying the carrier frequency by two. The squarer 508 removes the 180-degree phase shifts of the BPSK modulation and creates a rectified signal at the doubled frequency free of any phase shifts.

Following the squarer 508, the signal is then passed to a band pass filter 510. The band pass filter 510 removes unwanted frequency terms outside the doubled carrier frequency. The filtered signal is passed to the PLL 502. The PLL 502 filters out the noise that may have been present within the frequency bandwidth passed by the band pass filter 510 and locks to the double frequency input with synchronicity in frequency and phase. Next, a frequency divider 512 divides the double frequency in two to create a replica of the input signal carrier at the original frequency and in phase.

After the incoming signal is sensed, the PLL 502 may need a period of time (acquisition time) to lock-in in phase and frequency. The acquisition time depends on various parameters such as the input level of the incoming signal, the noise level, the PLL phase comparator gain, the VCO gain, and the transfer function of its optional loop filter.

The locked-in oscillator signal and the input signal feed the PSK demodulator 328. The resulting symbol waveforms can be further filtered before undergoing analog to digital conversion 330 (FIG. 3) to convert the waveform of the symbols to their corresponding bits.

Using Super-Regenerative Amplifier (SRA) Topology

FIGS. 6A-6E illustrate example SRA circuits. In general, an SRA is a regenerative amplifier that uses a feedback loop to increase the gain of the SRA over some period of time. The SRA is typically a time-variant circuit. In some implementations, the SRA can increase the gain to some designed maximum value, for example, in an exponential or linear fashion. Furthermore, the SRA periodically resets the progressive amplification.

Figure 6C:
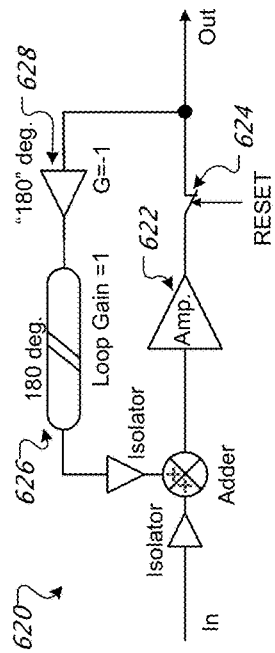
FIGS. 6A-6E illustrate example SRA circuits.
Figure 6A:
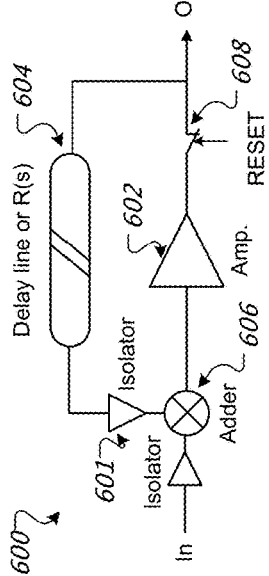

FIG. 6A shows an example circuit of a typical SRA 600. The SRA 600 includes an amplifier 602 and a delay line 604. An input signal can pass through an isolator 601 to the amplifier 602. A portion of the amplifier 602 output is routed to the delay loop 604 while the remainder is output from the SRA 600. The delay line 604 provides a specified phase delay for the amplified signal that depends on the length of the delay line. For example, the delay line 604 can provide a delay of 360 degrees. The delayed signal is then passed to adder 606 which adds the delayed signal back to the input signal for amplification.

In each example SRA, the delayed signal can be in phase with the input signal as long as the input to signal does not change phase. When the input phase changes, the change won't be reflected in the delay line for a period of time because of the delay path. The delay line 604 can include an isolator to prevent signals from passing in a reverse direction through the delay line 604. The amplifier 602 will then amplify the combined signal, further increasing the total signal gain. The process repeats with increasing amplification of the input signal for a maximum regeneration time at which a reset occurs. A reset switch 608 opens the circuit in response to a reset signal such that the amplification of the input signal is reset.

The SRA 600 provides a number of features. After reset, the SRA quickly begins regenerating, i.e., the amplification cycle begins again. The SRA provides a high gain with a single stage. The SRA can be configured to provide linear or exponential gain, the particular frequency selectivity can be specifically set, as well as providing for independent adjustment of multiple SRA parameters including the amount of gain for each cycle and reset conditions. A linear gain may be used to provide greater control as compared to an SRA having an exponential gain. The SRA can further be used to replace the phase synchronization structures used for demodulation, e.g., PLL, Costas Loop, local oscillator, and/or frequency extraction circuits described above with respect to FIGS. 3-5. In some implementations, the delay line can be replaced by a suitable bandpass filter, e.g., a tubular bandpass filter. The delay line may be limited to a minimum delay amount, for example, 180 degrees.

Figure 6D:
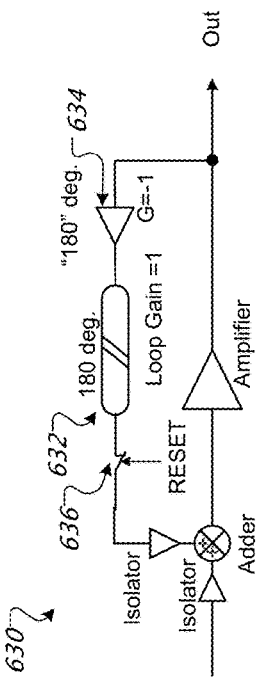
Figure 6B:
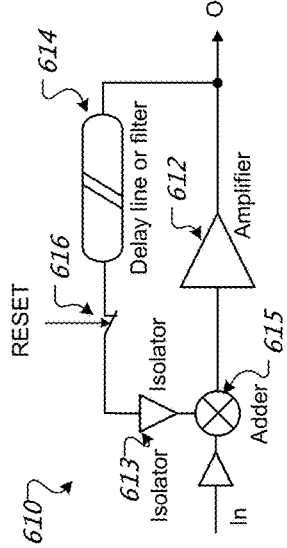

FIG. 6B shows an example circuit of a SRA 610. SRA 610 is similar to the SRA 600 and includes amplifier 612, isolator 613, adder 615, and delay line 614. However, in the SRA 610 a reset switch 616 is positioned along the same path as the delay line 614 so that the reset opens the delay line 614 path rather than the direct path from the amplifier 612 to the output.

This configuration may have some advantages when the regeneration time is very short. First, positioning the reset 616 in the delay line 614 keeps the input signal present to the output even when the reset mode is active. Second, when the reset pin is released, the SRA 610 starts the regeneration process immediately, which can result in a faster regeneration of one more cycle of the carrier frequency as compared to the SRA 600 of FIG. 6A.

For example, if the delay provided by the delay line 604 of SRA 600 is 360 degrees, the carrier frequency (Fc) is 100 GHz (=10 ps (picosecond) period) and the symbol rate is 10 Gigabits per second "Gbps" (corresponding to a 100 ps symbol duration), the maximum regeneration time assuming a reset time of 10% of the symbol duration becomes 90 ps and provides 90 ps/10 ps=9 regeneration cycles. By contrast, the same parameters with SRA 610 can provide 10 regeneration cycles within the same time.

For the SRA 600, the maximum number of regeneration cycles before reset can be calculated for a particular amount delay provided by the delay line (360 degrees) and for a cycle beginning at the middle of an incoming symbol. Specifically, the maximum number of regenerations is calculated according to:

$$\# \text{regeneration cycles} = \left(\frac{T_{symbol}}{T_c}\right)\left(\frac{\text{regeneration time}}{\text{regeneration time} + \text{reset time}}\right)$$

where $T_{symbol}$ corresponds to the incoming symbol time (i.e., the inverse of the data rate) and $T_c$ is the carrier period $1/F_c$.

Therefore, in one specific example if the carrier frequency Fc is 50 GHz, which corresponds to a $T_c$ of 20 ps, the BPSK Symbol time $T_{symbol}$ is 200 ps (for a 5 Gbps data rate), the regeneration time is equal to 80% of the incoming symbol time, and the reset time is equal to 20% of the incoming symbol time, then there are eight regeneration cycles for the SRA 600 prior to reset.

For the SRA 610, also having a delay of 360 degrees in delay line 604, the maximum number of regeneration cycles is calculated the same as for above for SRA 600 with one additional regeneration cycle.

Therefore, the number of regeneration cycles for the SRA 610 for the same example values used above with respect to SRA 600 is nine. The number of regeneration cycles correspond to a number of maximum rectified envelope amplification of the signal by the SRA in one stage which is significant for high speed high frequency system.

FIG. 6C shows an example circuit of a SRA 620. SRA 620 includes amplifier 622 and reset 624 positioned in the direct line from the amplifier 622 and the output. The feedback path includes both delay line 626 and an inverter 628. The delay line 626 and inverter 628 each provide a delay of 180 degrees. In particular, the inverter 628 has a gain of (−1) which is equivalent to a change of 180 degree but with no or little delay. An advantage of this configuration is that it requires only half of the length of the delay line 626 as compared, for example, to the delay line 604 of SRA 600. Furthermore, the SRA 620 regenerates twice faster because two regenerations happen per full cycle of the carrier versus one. Specifically, with a shorter delay line, it only takes half a period of the carrier frequency to be added back to the input (180-degree shift delay) e.g., 10 ps versus waiting a full period that takes twice the time (360-degree shift delay), e.g. 20 ps.

Because of the shorter delay, the max number of regeneration cycles for SRA 620 with a delay now of only 180 degrees is doubled as shown by:

$$\# \text{regeneration cycles} = 2\left(\frac{T_{symbol}}{T_c}\right)\left(\frac{\text{regeneration time}}{\text{regeneration time} + \text{reset time}}\right)$$

Using the same parameters as above with respect to SRA 600, this results in double the maximum number of regenerations for SRA 620, e.g., 16 regeneration cycles before reset rather than 8.

FIG. 6D shows an example circuit of a SRA 630. SRA 630 is similar to the SRA 620 of FIG. 6C. However, in addition to using the delay line 632 providing a delay of 180 degrees and an inverter 634 having a gain of (−1) to provide an equivalent to an additional 180 degree delay, a reset switch 636 is positioned within the feedback loop of the delay line 632. Similar to the SRA 630, the delay line 632 is shortened by only providing a 180 degree delay. Additionally, the position of the reset switch 636 in the delay loop portion allows for the input signal to continue to pass to the output even during a reset. Furthermore, as with the example SRA 610 of FIG. 6B, positioning the reset out of the direct line of the input signal can increase regeneration relative to the SRA 620 of FIG. 6C.

SRA 630 combines the shorter delay line with the reset switch further increases the maximum number of regeneration cycles. As a result, the maximum number of regeneration cycles double the regeneration cycles of SRA 600 plus one regeneration cycle as illustrated by SRA 610, which is illustrated by the following equation:

$$\# \text{regeneration cycles} = 1 + 2\left(\frac{T_{symbol}}{T_c}\right)\left(\frac{\text{regeneration time}}{\text{regeneration time} + \text{reset time}}\right)$$

The SRA topologies shown in FIGS. 6C and 6D can be advantageous over the SRA topologies of FIGS. 6A and 6B because they regenerate faster and provide higher amplification for a similar current consumption. By contrast, an advantage of the SRA topologies of FIGS. 6A and 6B is that the input and intrinsic noise are amplified at a slower rate as compared to the SRA topologies shown in FIGS. 6C and 6D, which can result in a lower output noise.

Figure 6E:
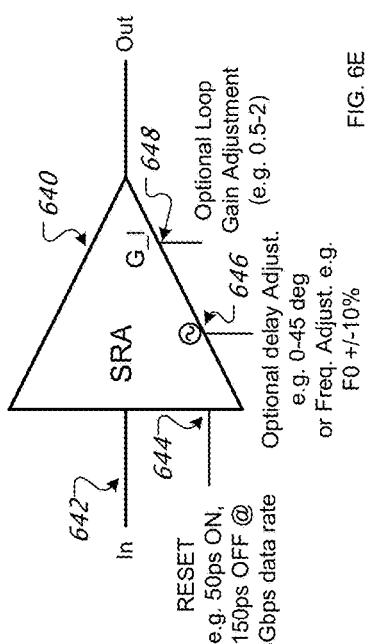

FIG. 6E shows a symbolic representation 640 of an SRA, e.g., for use in circuit diagrams showing BPSK demodulation. The symbolic representation can be used to represent any of the SRA topologies described in this specification, e.g., FIGS. 6A-6D. At the left side of the symbolic representation 640 are positioned an input signal input 642 and a reset signal input 644. An optional delay/frequency adjustment 646 is shown and may be used in particular applications. A typical delay adjustment can be, for example, 0 to 45 degrees. Alternatively, a typical frequency adjustment is +/−10% of the central resonant frequency. An optional loop gain adjustment 648 has also been added in case of need. A typical loop gain adjustment is 0.0 to 2.0. The delay adjustment, frequency adjustment, and loop gain adjustment can be independently adjustable parameters.

In another implementation of SRA 620 and 630, the negative unity gain and adder are combined in one function such that the negative gain block is deleted and the adder is replaced by a subtractor, for which the loop signal is subtracted from the input signal as opposed to being added. In other words, the subtractor results in a signal corresponding to the input signal minus the delayed loop signal. Another example of using a subtractor is described below with respect to FIG. 14.

Figure 7:
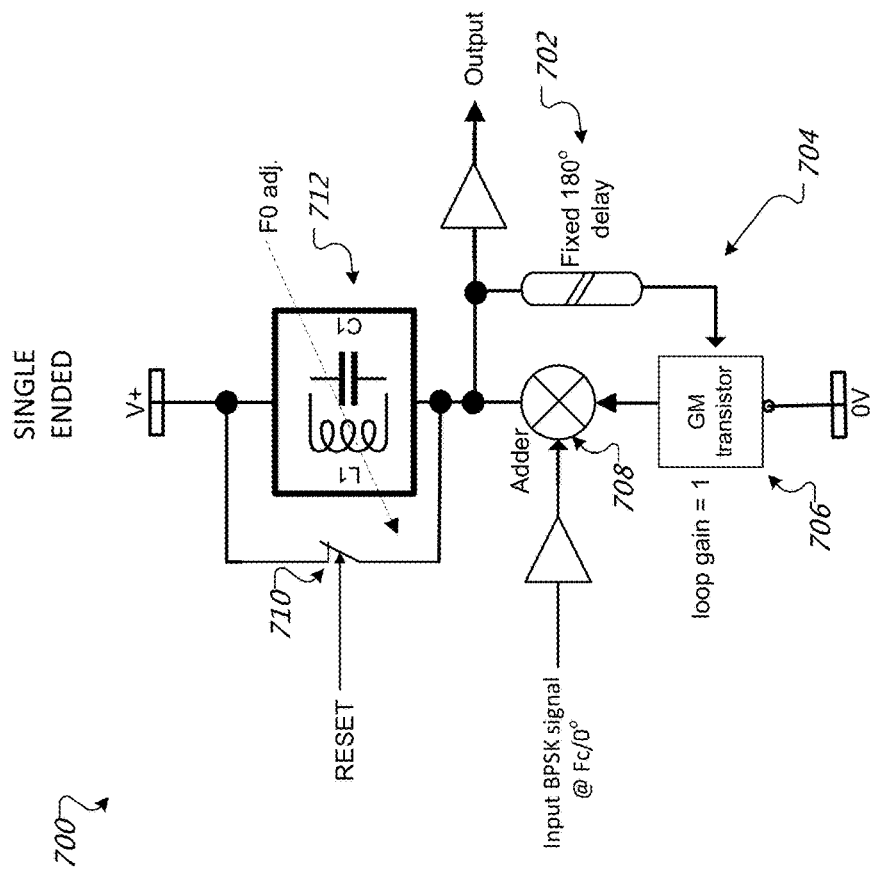
FIG. 7 is a block diagram of an example of another SRA circuit.

FIG. 7 shows yet another implementation of SRA 700 that uses an oscillator amplifier 700. The SRA 700 has a 180-degree fix delay 702 built as part of its topology. The delay line 702 can be real or virtual. If virtual, it can be provided by the topology of the functions of FIG. 7 (the way the components are connected together), described in greater detail below. The output of the SRA 700 also includes a resonant circuit 712 tuned by an amplifier gm cell 706 to frequency F0 where frequency F0 is close or substantially equal to the input carrier frequency. The input signal is added to the resonant circuit output with an adder 708 and the summed signal conveyed to an output.

Different techniques can be used to tune F0 to Fc. In one implementation, before the data communication starts there is a training sequence. A transmitter is instructed to send the carrier frequency without any modulation signal. The reset is clocked and may be close to the symbol rate, but no synchronization is used at this stage. The reset may be clocked with a cyclic regeneration period and a reset period for instance a regeneration period of 80% and a rest period of 20%. The tuning of F0 is changed sequentially step by step and the maximum amplitude of regeneration rectified signal envelope is recorded for each step. For example, referring back to FIG. 6E, the delay adjustment 646 is adjusted in discrete steps, such that $V_{max}$ is identified for the step in which F0 is substantially close to Fc. The maximum amplitude $V_{max}$ is obtained when F0 is substantially equal to Fc. The tuning of F0 to $V_{max}$ is set and maintained for at least a period of time during the data communication.

The resonant circuit 704 provides an oscillation behavior in phase with the input signal. The reset signal to reset switch 710 resets the energy contained in the circuit at the end of the regeneration. In this implementation, since the delay is fixed, an optional adjustment of F0 to match the input carrier frequency Fc can be performed by adjusting the resonance of a resonator 712. The resonator 712 can use various resonant circuits such as a discreet inductance-capacitor LC, a delay line, a resonator, SOW, SAW, etc.

For a linear amplification mode, the oscillator circuit must provide a loop gain of unity gain. If no input signal is present, the circuit may start to oscillate by itself due to noise in the input or in the SRA. However, this oscillation may take a long time relative to the input symbol rate and should not be a concern in this implementation because the SRA 700 is reset at a rate similar to the incoming symbol rate. In some cases, a very long series of "1" or "0" bit values may result in self-oscillation of the circuit. To prevent this, digital coding such as non-return to zero ("NRZ") can be added using suitable conventional techniques. With the addition of the input signal, the oscillatory regeneration starts immediately with the input signal being additive to the output.

Figure 8:
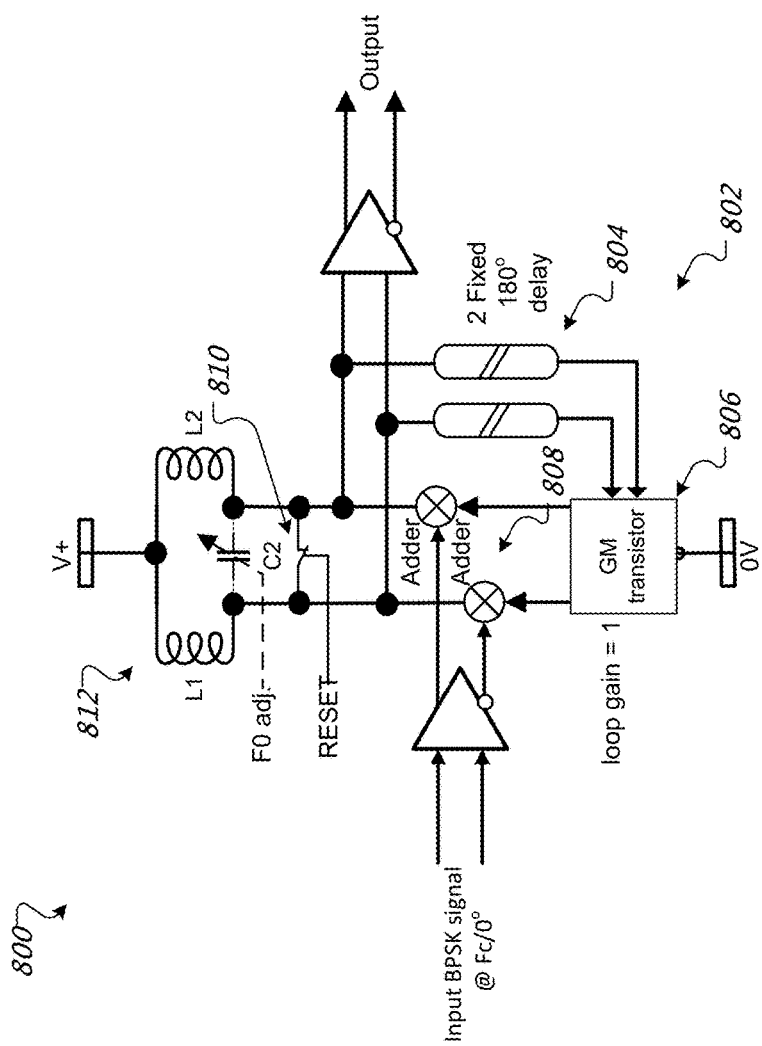
FIG. 8 is a block diagram of an example of another SRA circuit

FIG. 8 is a block diagram of another implementation of an SRA 800 that uses an example oscillator amplifier. SRA 800 provides an SRA where the signal is differential rather than single ended as in the SRA 700. Some applications where this may be important include when the frequency is very high and consumed current is critical. A differential approach gains generally a factor of two in gain and provides higher common mode rejection against random noise and deterministic sources of noise including, for example, clocks or other signals/frequencies used in the system.

To provide a differential signal, the input signal is separated into two signals having a 180-degree phase difference. The two signals pass through distinct paths of a resonant circuit 802, each path of the resonant circuit 802 including respective delay lines 804 each fixed at 180 degrees to an amplifier gm cell 806. The delay lines 804 can be real or virtual. If virtual, they can be provided by the topology of the functions of FIG. 8 (the way the components are connected together). The resonant circuit 812 is tuned by the amplifier gm cell 806 to frequency F0 where frequency F0 is close or substantially equal to the input carrier frequency. The separate input signals are added to the respective resonant circuit outputs by adders 808 and the summed signals conveyed to a differential output.

A reset signal to reset switch 810 resets the energy contained in the circuit for both signals at the end of the regeneration. In this implementation, since the delay is fixed, then optional adjustment of F0 relative to the input carrier frequency Fc is done by adjusting the resonance of a resonator 812. The resonator 812 can use various resonant circuits such as a discreet inductance-capacitance LC, a delay line, a resonator, SOW, SAW, etc.

In some implementations, the SRA, e.g., an SRA similar to those shown in FIGS. 6-8, may eliminate one or more of the isolators. In some implementations, an isolator may be replaced with another component. For example, an input isolator may be replaced by an amplifier of gain G2. In some other implementations, one or more adders, e.g., as shown in FIGS. 6-8, can be replaced by a subtractor and a 180-degree delay line. The subtractor corresponds to the input signal minus the delayed loop signal. The use of the subtractor can, for example, be used to eliminate the need for the inverse amplifier having gain of (−1) in FIGS. 6C and 6D.

The delay line in each of the SRA's described above, e.g., in FIGS. 6-8, represent both real delay lines and virtual delay lines. A real delay line is a delay caused by the line of transmission taking a particular length of time. This delay can be effectively created by other structures or connection topologies that change phase by a particular amount equal to some delay length. For example, the "virtual" delay can be provided by a filter with a group delay that is non-zero, e.g., a band pass or low pass filter. In another example, the delay can be provided by an amplifier having a gain of (−1) as shown in FIG. 6C. Similarly, a (−1) gain can be provided by a gm transistor structure as shown in FIG. 7. Here there is no physical delay but the signal is inverted. In some implementations, other structures can also provide the virtual gain, for example, particular combinations of transistor structures where the gates and drains are joined in a particular manner.

SRA Behavior

Gain Behavior

The gain of an SRA can be linear or logarithmic depending of its loop gain Gl. The loop gain represents the overall gain/attenuation of the loop including the amplifier, resetting, delay isolator and the adder. Assuming the input signal is a sinewave, the use of linear circuits, and a unity loop gain Gl=1, it can be shown with the topology, for example, of SRA 600 of FIG. 6A, that the output voltage become $v_{out}(t)=N \times v_{in}(t)$ where N is the number of regeneration cycles (N=fc/$f_{SYMB}$=ratio of carrier frequency by the symbol rate). If the delay is 180 degrees, the amount is doubled. For instance, if the symbol rate is 5 Gbps and the carrier frequency is 55 GHz, N=55/5=11 with a SRA having a 360-degree delay and the output voltage $v_{out}(t)$ would be 11×$v_{in}(t)$ after 11 cycles of the carrier frequency. However, with a delay of 180 degrees, the output voltage $v_{out}(t)$ become 22 $v_{in}(t)$ after the same regen time. Expressed in dB, a voltage gain of 11 is equivalent to 20 log(11)=20.8 dB. Alternatively, a gain of 22 in voltage corresponds to 26.8 dB. Thus, an SRA circuit can be used as a low noise amplifier replacement, and furthermore, the gain obtained can be high or very high versus a conventional single stage LNA.

However, when the loop gain Gl is more than one, for instance 1.3, the SRA is in logarithmic mode, that is it amplifies regeneratively with a roughly exponential growth, which can be expressed by the equation:

$$vout(Nc) = vin[G + G^2 + \ldots + G^N] = vin\sum_{N=1}^{\#c} G^N$$

For instance, if the symbol rate is 5 Gbps and the carrier frequency is 40 GHz, N=40/5=8 and the output voltage $v_{out}(t)$ would be $v_{in}(t) \times (1.3+1.3^2+1.3^3+\ldots)=31 \times v_{in}(t)$ after 8 cycles of the carrier frequency. Expressed in dB, a voltage gain of 31 is equivalent to 20× log(31)=29.8 dB. For a delay of 180 degrees, the growth is even faster and lead to much higher gain.

To increase the gain progressively for each cycle, a signal added to the input signal needs to be in phase with the input signal. When gain is increasing, the SRA builds up the output signal from the input signal starting with its initial phase and frequency. The delay line is designed to provide a 360 degree phase change to the signal and add them together and continue the regeneration until saturation or until a reset signal is provided. As described above with respect to the example SRA topologies, different SRA configurations can use a delay of 180 degrees with an inverter (gain of −1) to provide an equivalent 360 degree phase change. In another SRA configuration the delay line is replaced by a transfer function that shapes the signal according to its transfer function. The transfer function can be provided by a filter, a resonant circuit, a band pass filter, a frequency or phase selective function, etc. The incoming signal and the signal portion that passed in the delay line are added together in the adder.

In some instances, the delayed signal is not in phase with the currently input signal at the adder. For example, the phase delay can be 180 degrees but the addition in the adder is destructive and the amplitude reduces progressively to zero. This can occur, for example, when a modulated signal uses phase change to encode information, e.g., different phase for binary 1 and 0.

The value of the delay or the group delay provided by a filter delay depends on the particular frequency selectivity (quality factor) of the SRA and determines a range of frequency operation and/or the frequency bandwidth for the SRA. The best performance of voltage regeneration is obtained when the phase of the incoming signal is in phase with the one added to the adder through the delay line. For example, at 60 GHz the period of one cycle of carrier frequency is 1/F=1/60 GHz=16.7 ps. A delay of 360 degree corresponds to one wavelength and the length of the delay line for 60 GHz becomes c/F=3×10$^8$/50 GHz=6 mm for a permittivity of 1. In case of integration of the SRA on an integrated circuit (IC), the electrical length could be reduced by using a higher permittivity or using a 180-degree delay plus gain of −1 which would reduce its length by a factor 2.

SRA Amplitude Behavior—AM Demodulation

In some implementations, the SRA may be used as an amplitude modulation discriminator. The discussion of gain behavior described how the SRA provides an amplified output voltage with time that can be sampled and reset periodically. The SRA may demodulate an amplitude modulated signal (AM) or any form of digital AM such as ASK since the rectified output envelope is N×$v_{in}$(t), where N is the number of regen cycles and $v_{in}$(t) a possibly AM modulated signal. For instance, ASK has two amplitude levels of A1=1V and A2=0.2V as A1(sin(wt)) or A2(sin(wt)) and N=5. If the SRA is reset periodically in synchronicity with the symbol rate, bit "1" creates the voltage A1 at the SRA's input and becomes N(A1), which equals 5 V at its output while A2 provides respectively N(A2), which equals 1 V. It is easy to slice at a threshold level of, for example, 1V and discriminate the binary "1" as corresponding to voltages above 1 V and the binary "0" as corresponding to voltages at or below 1 V.

SRA Phase Behavior-PSK Demodulation

Figure 9:
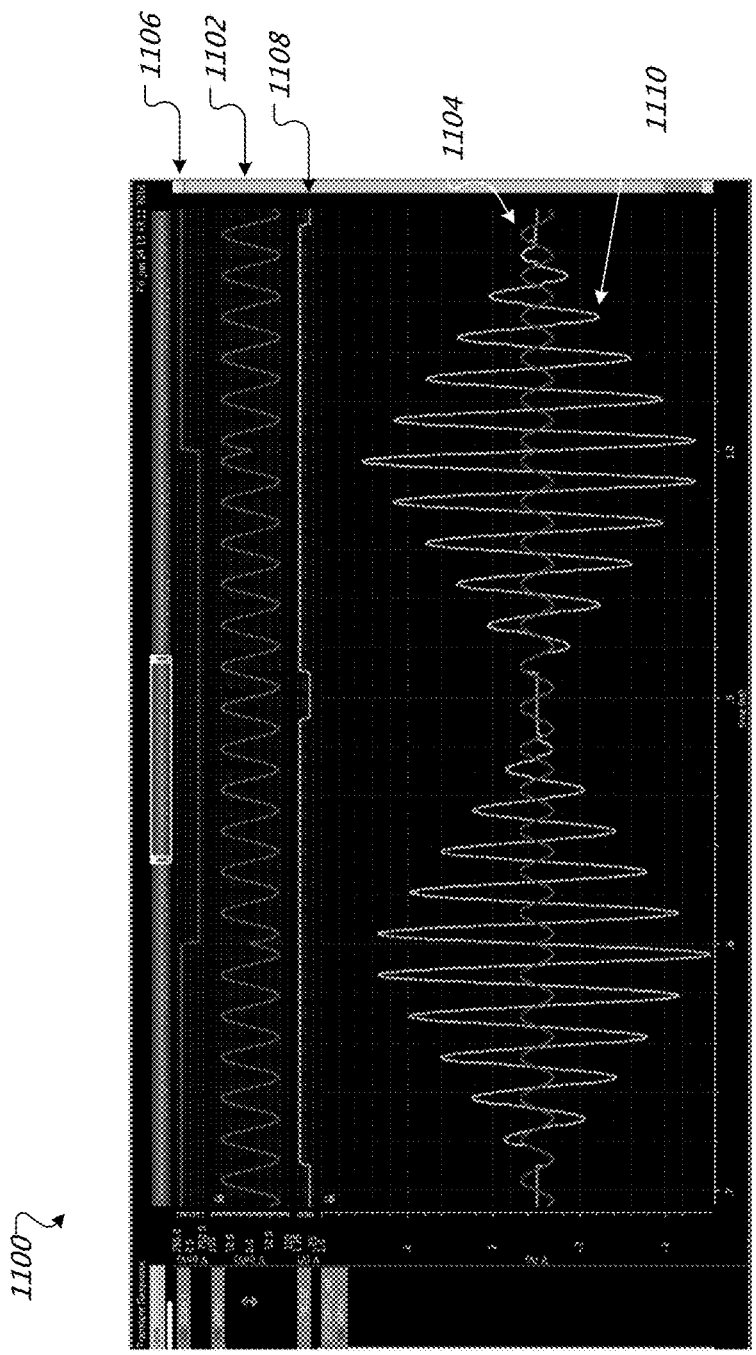
FIG. 9 shows a display of example waveforms created by a SRA of unity loop gain.

FIG. 9 shows a display 1100 of example waveforms created by a SRA of unity loop gain. In the display 1100, a BPSK input signal, is represented twice: (1) In the top portion of the display 1000 zoomed as signal 1102 and (2) within the main SRA trace as signal 1104 using the same vertical scale to show a progressive amplification effect provided by the SRA. The unmodulated incoming data stream 1106 is shown as well as an inverted reset signal 1108.

In this example, the symbol time is chosen to 200 ps (5 Gbps data rate) and the carrier frequency is 60 GHz. Also the reset signal can be chosen to be 10% of the symbol time, which corresponds in this example to 20 ps. With these example values, the maximum regeneration time is 180 ps, which corresponds to about 11 cycles of the carrier frequency.

In this example, the input signal undergoes a phase change corresponding to a change in the data stream to a different binary value. A phase transition of 180 degrees can be identified at around 0.8 ns and 1.0 ns. The SRA output signal 1110 represents the output of the SRA over two transitions of phase. As shown, the output signal envelope 1110 grows linearly with time but in response to the change of phase of 180 degrees at 0.8 ns and 1.0 ns, the output signal 1110 keeps the same phase but decreases linearly during each regeneration cycle until reaching zero. In other words, the first phase of 0.7 ns to 0.8 ns was a coherent constructive amplification while the second phase of 0.8 ns to 0.9 ns was a coherent destructive amplification leading toward zero.

The reset signal 1108 is generated with a phase/frequency in synchronicity with the incoming symbol rate, and provided by the synchronization function. The synchronization function is described in more detail below with respect to FIG. 16. In this implementation, the reset signal 1108 is delayed by half a symbol relative to the incoming data stream 1106 in order for the SRA to respond to phase change in the middle of a regeneration phase. Additionally, the fast growth of the regeneration is due in this example to a chosen delay of 180 degree and inversion in the SRA loop (e.g., as in the example SRA shown in FIG. 6C or FIG. 6D) as compared to a 360-degree delay line.

Figure 10:
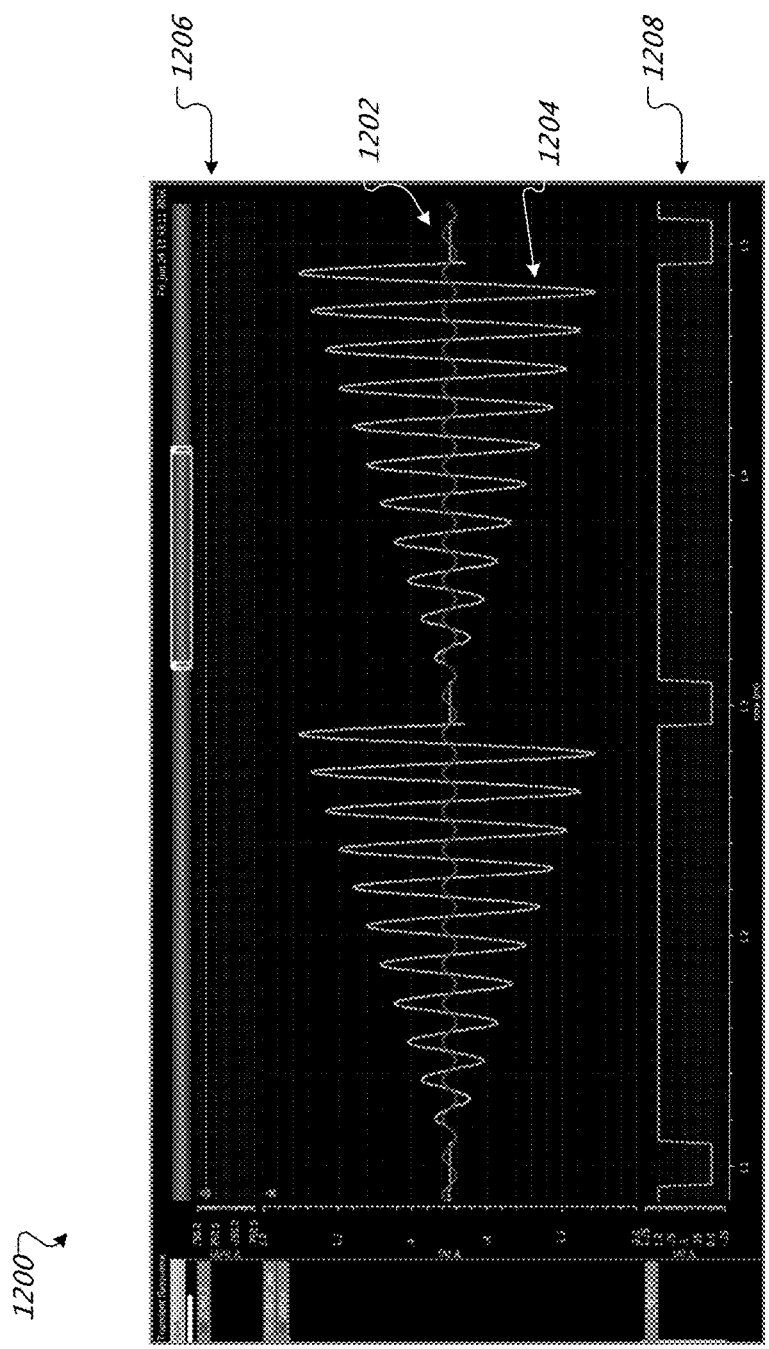
FIG. 10 shows a display of example waveforms created by a SRA of unity loop gain.

FIG. 10 shows a display 1200 of example waveforms created by a SRA of unity loop gain. The display of FIG. 10 illustrates the opposite scenario where the phase change is 0 degrees throughout (no phase change). Similar to the display 1100 of FIG. 9, the display 1200 shows a BPSK input signal 1202 along with an SRA output signal 1204 using the same vertical scale to illustrate the amplification effect. As shown, the BPSK input signal 1202 does not change phase. The resulting SRA output signal envelope 1204 grows until twice the maximum level of the SRA output signal 1110 shown in FIG. 9. The unchanged unmodulated data signal 1206 is shown at the top of the display 1200 and the inverted reset signal 1208 is shown near the bottom of the display.

The positive rectified envelope of the SRA output 1204 that was substantially zero volts at the end of the amplification cycle for a 180-deg phase change, becomes a large relative voltage $V_{max}$ for a 0-deg phase change. In this example, $V_{max}$ is substantially 22($V_{in}$) in this case of 2N=22 half cycles of carrier per one symbol bit time.

Thus, the SRA acts as an amplifier of gain 22 at a very high frequency and very fast data rate and converts the input phase information into an output voltage, a "0" translated in substantially zero volt and a "1" translated into $V_{max}$=22 ($V_{in}$). The next steps to demodulate the information include rectifying the signal, filtering the high frequency content (keeping the signal envelope), slicing the signal with a threshold voltage around the center between $V_{max}$ and zero, and sampling it at a time close to the end of the amplification cycle. Further digital processing can be done. These additional demodulation steps are described in greater detail below with respect to FIG. 14 to FIG. 16.

The SRA acting as a phase discriminator generates an output that is a function of a change in phase, not an absolute phase, therefore the SRA provides an output that is differential i.e. a differential phase demodulation discrimination. To recover the original bit stream, a differential to non-differential conversion may be used.

SRA Reset

The SRA is a time variant circuit that amplifies the input voltage progressively over time with linear or exponential growth. Consequently, the SRA needs to be reset at some point in time, one time or repetitively, to keep it functional in a given voltage operating range. For example, if the circuit is powered with 5 VDC (volts direct current), its output would grow and reach the limit, and saturate to 5 VDC or less if not reset before reaching this voltage or a lesser value that is in the operating voltage range, for instance 3.5 VDC. The reset signal is generally cyclic and can be provided by a clock or can be self-generated. Furthermore, in a communication system, the reset rate can optionally be made synchronous with the incoming data symbol rate.

In one implementation, the reset signal is asynchronous with the incoming symbol rate and is self-generated. Because the reset signal is asynchronous with the incoming symbol rate, the system can vary the amplification a specified amount higher or lower to change the timing without an external signal coming into the SRA, thereby providing self-generated reset.

As the reset signal is inactive the regeneration process continues and the input signal is regenerated coherently until its rectified envelope voltage reaches a given threshold voltage in a comparator. At that point the reset is activated, and the signal is reset by the reset signal. As the rectified envelope of the signal decreases to zero and crosses the threshold level, the reset is deactivated and the cycle restarted. In this configuration. The regeneration time is dependent of the input voltage and of the threshold voltage. Regeneration will be faster for a higher input voltage and slower for a lower input voltage. For the purpose of BPSK demodulation, it is preferred to keep the SRA's input voltage constant to avoid combined AM and PSK demodulation. This can be accomplished by the adjunction of an amplitude gain control (AGC) at the input of the SRA.

In some implementations, each SRA is configured to perform a specified number of amplification cycles across at least one symbol length prior to a reset being triggered. The sampling is non-synchronous with the incoming symbol rate. According to the Nyquist criteria this means that at least two regenerations per symbol are needed. As an example, if the symbol rate is 1 Gbps (corresponding to 1 ns $T_{symbol}$) at a carrier frequency of 60 GHz (corresponding to a 16.7 ps $T_c$), three regenerations per symbol can be chosen. This results in three regenerations of 333 ps long each. At least one of these three regenerations can be affected by a potential change of phase between one incoming BPSK symbol and the next BPSK symbol. After pseudo synchronous demodulation and filtering the envelope of the rectified amplitude signal will be lower for one of the regenerations than the two other regenerations. The difference can be processed as a change of phase.

In another implementation, the reset signal is self-generated and made synchronous with the incoming symbol rate. The behavior is similar to the asynchronous implementation except that a synchronization mechanism is added. This mechanism can control the gain of the AGC to accelerate or decelerate the speed of regeneration such as keeping the SRA synchronized with the incoming symbol rate.

In some implementations, the width of the reset pulse signal may be very close to zero but in practice the energy stored in the SRA such as in capacities, transistors, inductances or delay lines need to be discharged to a low quiescent value. In one implementation the reset rate time is fixed to a portion of the incoming symbol rate, n %. The n % range can be from 0.01% to 99.9%. For very high speed systems, the value range can be 20% to 50%.

Referring back to FIGS. 9 and 10, the SRA reset signal period of 1108, 1208, is equal to one symbol time of the incoming data rate and synchronous in phase to it. For the application of discriminating PSK, the timing of the reset signal can be set to place the change of symbol in or near the middle of the SRA regeneration cycle. In such a scenario, two regeneration phases can be defined. Regeneration phase 1 where the SRA amplifies progressively and always up to N1× $v_{in}(t)$ irrespective of phase change (since no phase changes happen during this time). In regeneration phase 2, two cases can occur: In case 1, no phase change happens from the previous incoming symbol to the next such that the SRA continues to regenerate up to the end of its cycle reaching $V_{max}$ (0-degree phase change). In case 2 however, and as previously described, a phase change of 180-degrees can happen from the previous to the next symbol. In that case, the SRA reduces progressively its output voltage until reaching the minimum value close or substantially to zero. The SRA therefore behaves as a phase change detector and provides an output voltage rectified envelope signal corresponding to the phase change.

More generally, at least one reset cycle's regeneration amongst multiple reset cycle's regenerations can be affected by a change of phase between one incoming BPSK symbol and the next. Consequently, the envelope of the rectified amplitude signal for this one reset cycle's regeneration is lower in comparison to at least one other reset cycle's regeneration. This difference can be processed as the change of phase.

In some implementations, a mechanism of synchronization and tracking to the incoming symbol rate timing may be needed for proper operation. This may be accomplished with a processing function such as a digital PLL and digital processing.

Multiple Interleaved SRAs for Demodulation

Figure 11:
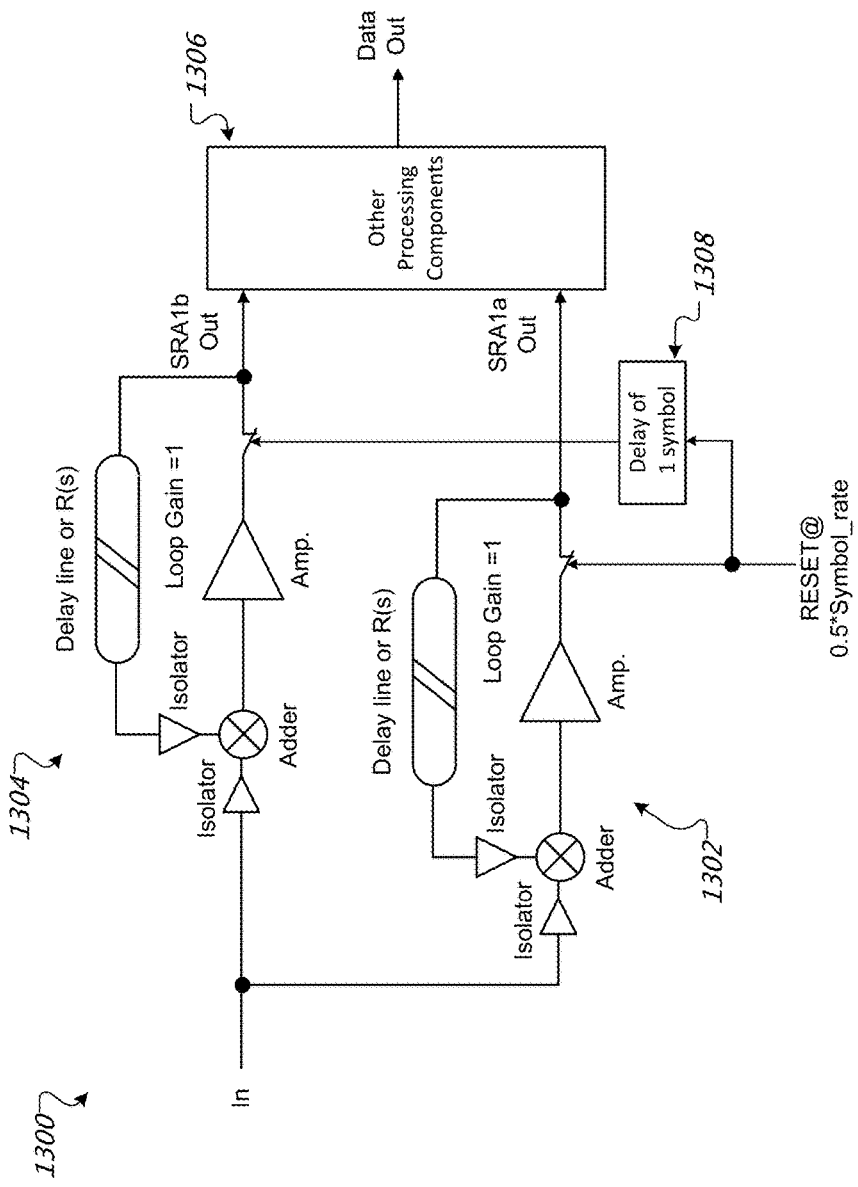
FIG. 11 shows a block diagram of a portion of an example BPSK demodulator including two SRAs.

FIG. 11 shows a block diagram of a portion of an example BPSK demodulator 1300 including two SRAs. In particular, FIG. 11 shows two SRAs 1302 and 1304 used in tandem (in parallel) and each set to regenerate over a double symbol length of time with a delay of one symbol between them. In FIG. 11, each SRA corresponds to the topology of SRA 600 in FIG. 6A. Each of the SRAs 1302 and 1304 have a half symbol rate reset timing in an interleaved fashion. Each SRA 1302, 1304 is aligned exactly in phase with the 2 symbols. SRA 1302 is set to regenerate SYMB#N and SYMB#N+1 while SRA 1304 regenerates SYMB#N+1 and SYMB#N+2. Specifically, a 1 symbol delay 1308 is introduced on the path to SRA 1304. In the next cycle, SRA 1302 is set to regenerate SYMB#N+2 and SYMB#N+3 while SRA 1304 regenerates SYMB#N+3 and SYMB#N+4, etc.

The output information is successively available from SRA 1302, SRA 1304, SRA 1302, SRA 1304, etc. Each SRA needs 2 symbols to reach maturity and since their timing is interleaved the valid succession of phase change of the incoming data stream is given at the alternating output of SRA 1302, SRA 1304, SRA 1302, etc. Using two interleaved SRAs is more complex but has the benefit of providing more time (double symbol time) to regenerate compared to the example SRA topologies with a single SRA in FIG. 6 to FIG. 8. When the ratio between carrier frequency and the symbol rate becomes lower than, e.g. 25, and that the frequency is high or very high relative to the electronic capabilities of the IC process or available technology, a double regeneration scheme may be a suitable approach. The interleaved output of the two SRA's can be processed by additional demodulator components, represented by block 1306, to complete the BPSK demodulation. This processing can include pseudo synchronous demodulation, filtering, amplification, slicing and/or sampling, as will be described in further detail below.

Figure 12:
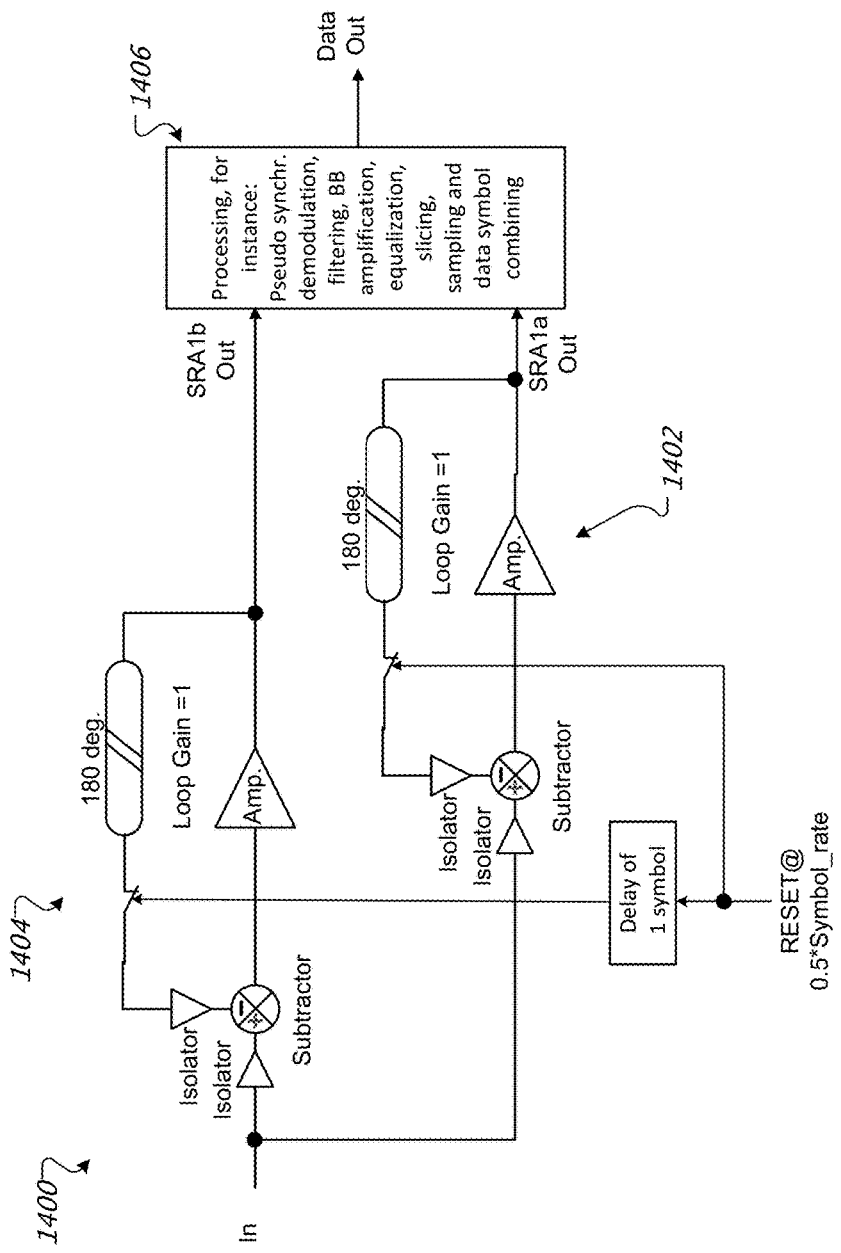
FIG. 12 shows a block diagram of a portion of an example BPSK demodulator including two SRAs.

FIG. 12 shows a block diagram of a portion of an example BPSK demodulator 1400 including two SRAs. In particular, FIG. 12 shows two interleaved SRAs 1402 and 1404 in which the delay line has been reduced to 180 degrees for faster regeneration (high data speed or very high frequency or both). Each SRA 1402 and 1404 also includes a subtractor that replaces the loop adder shown, for example in the prior SRA topologies. The subtractor may simplify the topology and combine the function inverter function gain of (−1) and the adder. Additionally, each SRA has a respective reset switch positioned in the delay loop rather than the direct path of the amplifier. The subtractor results in a signal corresponding to the input signal minus the delayed loop signal. As with FIG. 11, the SRAs 1402 and 1404 are arranged in parallel and are set to regenerate over a double symbol length of time. The output information from the SRAs 1402, 1404 is successively available from SRA 1402, SRA 1404, SRA 1402, etc. The interleaved output of the two SRA's can be processed by additional demodulator components, represented by block 1406, to complete the BPSK demodulation. This processing can include pseudo synchronous demodulation, filtering, amplification, slicing and/or sampling, as will be described in further detail below.

Figure 13:
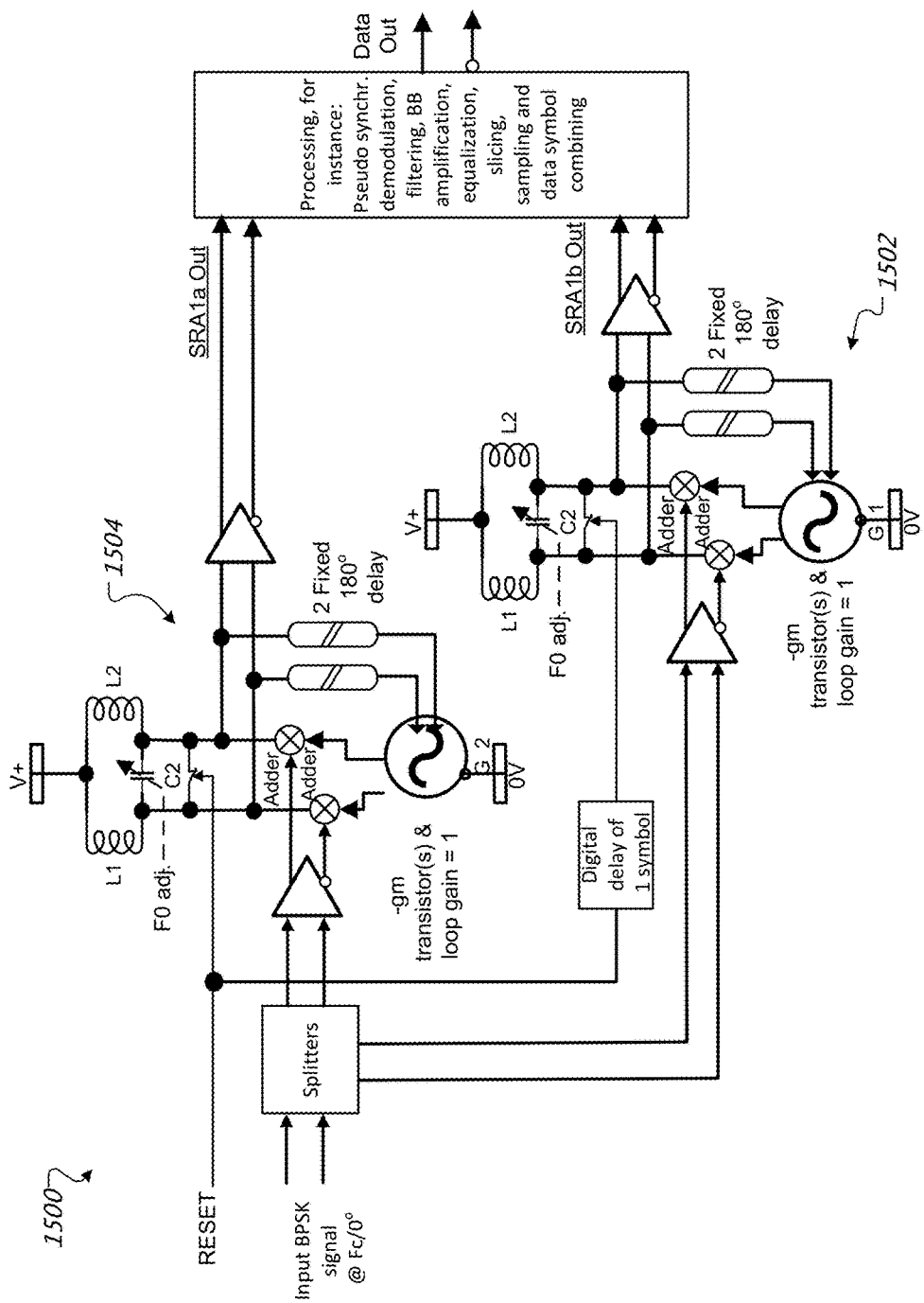
FIG. 13 shows a block diagram of a portion of an example BPSK demodulator including two SRAs.

FIG. 13 shows a block diagram of a portion of an example BPSK demodulator 1500 including two SRAs 1502 and 1504. In FIG. 13, the SRA output and processing is similar to that of FIGS. 11-12 above. However, the topology of the respective SRAs 1502, 1504 are different from the earlier demodulators. Specifically, each SRA 1502, 1504 can be similar to the differential SRA shown in FIG. 8, which includes a resonator and amplifier gm cell structures with fixed delays.

Although particular SRA topologies are illustrated in FIGS. 11-13, other topologies, e.g., SRA topologies in FIGS.

6-8, can be applied to the BPSK demodulator using interleaved SRAs. For instance, the synchronization phase may require more information than provided by one or two SRA chains in order to perform the synchronization process.

In yet another implementation, the SRA may be set to match one symbol length in phase, starting at the beginning of the symbol and being reset at the end of the symbol time.

BPSK Transceiver

Figure 14:
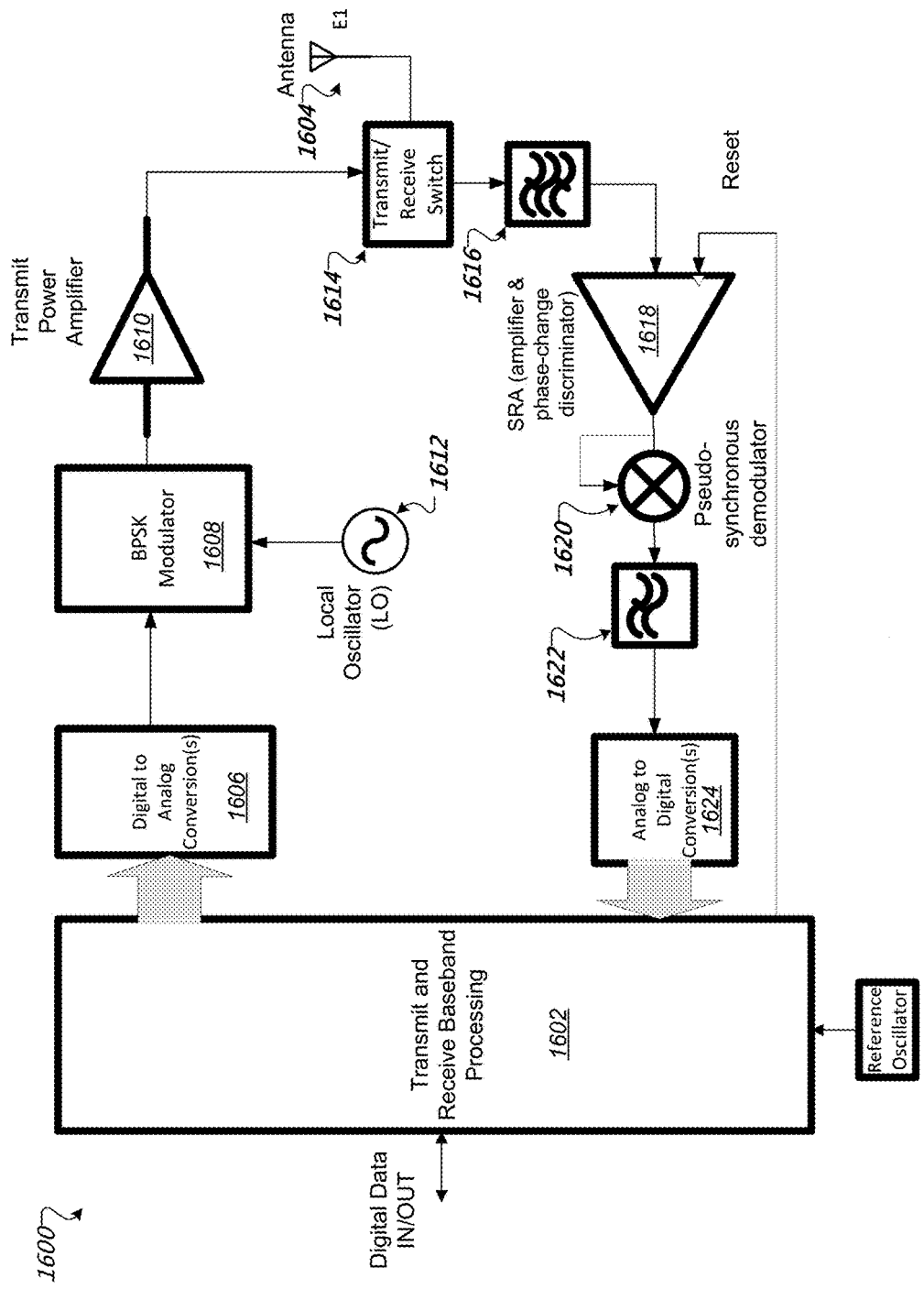
FIG. 14 is a block diagram of an example communication system including BPSK demodulation.

FIG. 14 is a block diagram of an example communication system 1600 including BPSK demodulation. In particular, the communication system 1600 can perform modulation and demodulation for EHF frequency transmissions. The communication system 1600 uses one or more SRAs 1618 to provide both amplification and phase change discrimination. The symbol diagram for the SRA can correspond to a number of different SRA topologies including those described with respect to FIGS. 6A-D to FIG. 8. Additionally, in some implementations, the single SRA can be replaced by two interleaved SRAs, for example, as shown in FIGS. 11 to 13. In particular, each SRA is typically configured to have a loop gain of 1.0. The communication system 1600 does not require synchronous demodulation and consequently does not require a LO, PLL, Costas loop or carrier extraction from the incoming signal to perform demodulation. By the same token, a corresponding transmitter may not require a PLL to perform modulation if its local oscillator is stable enough, has low phase noise, and has a limited range of variations, e.g., with temperature.

The use of an SRA for BPSK demodulation provides a simplification of the BPSK receiver and demodulator as compared to conventional demodulation (e.g., as shown in FIG. 3). It further simplifies the modulator required for transmitting the BPSK signal. When implemented as a system with very fast means of data rate communication on a printed circuit board or as an integrated circuit, this provides advantages including reduction of complexity, reduction of size, and significant reduction of power consumption. Reduction of power consumption may be of great value in applications, for example, associated with mobile devices such as smartphones where low power consumption and battery life are important considerations.

The communication system 1600 includes both modulation and demodulation paths for data transmission and data reception, respectively; for example, for a transceiver used to both transmit and receive data depending on the set mode for the transceiver. A single structure is shown for convenience, however, in some other implementations, the paths can be independent and associated with distinct antennas, e.g., of different IC packages, without changing the general functioning of the modulation and demodulation.

To transmit modulated data, incoming digital data can be initially received by transmit and receive baseband processing 1602, which manages RF functions for the communication system 1600. The baseband processing can include performing synchronization, tracking, digital processing, and encoding (alternatively decoding of received data) of unmodulated digital signal in a similar manner as described above with respect to transmit and receive baseband processing 302 (FIG. 3). After processing, the data is then passed along a modulation path toward an antenna 1604. The antenna 1604 then transmits the modulated signal, e.g., toward a receiver of another device.

In some implementations, the antenna 1604 is replaced by an RF cable that couples the transceiver 1600 to a remote transceiver unit. The RF cable can be selected from one or more suitable cables including, for example, an RF coaxial cable, a line of transmission, a leaky RF cable, a twisted pair, a cable, etc. This communication configuration may provide higher EMI isolation, lower susceptibility, and lower crosstalk. Another advantage could be the reduced attenuation of propagation relative to propagation in air.

In yet some other implementations, instead of an antenna or cable, communicating devices can be coupled using a waveguide. Coupling to the waveguide requires a waveguide launcher. The waveguide launcher includes a probe to feed RF energy to the waveguide. The other end of the waveguide is coupled to a second waveguide launcher coupled to a remote transceiver similar to 1600. Since a waveguide is generally a closed electrical conductive structure, guiding an EM wave in its confined space from transmitter to receiver, the isolation with respect to the outside of the waveguide may be superior to a medium such as air between two antennas. Similarly, a waveguide may provide higher EMI isolation, lower susceptibility, and lower crosstalk than an antenna. Another advantage could be the reduced attenuation of propagation relative to propagation in air.

The modulation path includes a digital to analog converter 1606. The digital to analog converter 1606 converts the input digital data to waveform symbols each representing an integer number of bits. Therefore, each symbol represents a message consisting of N bits. The modulation path can include additional components not shown for convenience and clarity. These components can include an optional filter that limits the bandwidth of the signal before and after the modulator. The filter may be a low pass filter or band pass filter and implemented in a digital or analog fashion. If digital, the filter may be implemented in the baseband processing and located before the digital to analog converter 1606. If analog, the filter may be implemented after the digital to analog converter 1606 and, in some implementations, before the BPSK modulator 1608.

The BPSK modulator 1608 applies the symbols to a carrier signal. PSK modulation modulates the phase of the carrier signal by varying the sine and cosine inputs at a precise time. Each digital modulation scheme uses a finite number of distinct signals to represent digital data. PSK uses a finite number of phases, each assigned corresponding digital state that is a unique pattern of binary digits. In particular, BPSK uses two phases separated by 180 degrees (e.g., 0 degrees and 180 degrees). Usually, each phase encodes an equal number of bits. In particular, for BPSK, 1 bit per symbol is modulated so that a particular phase is used to represent a single bit as a binary 1 or 0 depending on the phase. For example, 0 degrees can represent a binary 0 and 180 degrees can represent a binary 1.

The carrier signal is generated by a local oscillator 1612. The BPSK modulator 1608 applies the modulation to the carrier signal generated by the local oscillator 1612. The modulation can be performed such that each symbol of the input data corresponds to a particular phase of the carrier signal. A simple local oscillator is used in place of a PLL, as the PLL is unnecessary in this architecture because the receiver does not need to lock onto the frequency of the transmitter and only needs to demodulate based on the difference of phase between two symbols.

The resulting BPSK modulated signal is amplified to a specified transmit power by amplifier 1610 and routed to the antenna 1604 for transmission. A transmit/receive switch 1614 can be used to selectively open the path to the antenna from the transmission path or to open the path for received data signals from the antenna 1604. In some implementations, the transmit/receive switch 1614 is not needed because the transmission of modulated data and the reception of modulated data are associated with dedicated antennas rather than shared (e.g., using a single transceiver). In yet another implementation, the switch 1614 is not needed since the transmitter may be switched OFF while the receive function is active and vice and versa.

When the antenna 1604 receives a modulated signal from another device, the transmit/receive switch 1614 routes the signal along a demodulation path to extract the digital data from the carrier signal. A filter 1616 can be used to filter any signals outside of the particular expected frequencies of the received signal.

In some implementations, the filter 1616 can be omitted since the SRA intrinsically provides a frequency selective function. If the SRA is delay-based, the fixed delay acts in a similar manner to a narrow band pass filter since the phase of 360 degrees (or 180 degrees) is occurring at a single frequency called F0=c/Fixed_delay. If the input carrier frequency carrier Fc is higher that F0, the delay becomes lower than 360 degrees (or 180 degrees) and the regeneration process is reduced.

Similarly, if the carrier frequency is lower that F0, the delay becomes higher than 360 degrees (or 180 degrees) and the regeneration is reduced as well. For example, if the delay is designed for an incoming carrier frequency of 30 GHz, one cycle of that frequency is 33.33 ps. Since one cycle is equal to 360 degrees for a sine wave carrier frequency, the delay would be designed to be a fixed value of 33.33 ps. Furthermore, one cycle of an interference carrier frequency of 35 GHz is 28.57 ps which corresponds to 308.59 degrees. Since the signal contributions are added with a 51 degree phase difference on the SRA adder, for example, as shown in FIG. 6A, the regeneration is not optimal therefore reduced, or cancelled.

In another example, one cycle of an interference carrier frequency of 25 GHz is 40.0 ps which corresponds to 432.0 degrees. Since the 2 signal contributions are added with a 72 degree difference on the SRA adder, the regeneration is again not optimal therefore reduced, or cancelled.

Referring back to FIG. 14, the filtered modulated signal then passes through an SRA 1618. The SRA can have one of the topologies described above and the described phase discriminating behavior. The SRA is a regenerative amplifier that uses a feedback loop to increase the gain of the SRA over some period of time. In some implementations, the SRA can increase gain to some designed maximum value, for example, in an exponential or linear fashion as described above. Furthermore, the SRA is periodically reset. The reset resets the progressive amplification.

In particular, the SRA 1618 receives a phase modulated signal and outputs a signal that has a rectified envelope voltage that can respond to the difference in phase. Thus, the SRA can convert the differences in phase to voltage values. In some implementations, the SRA 1618 is designed to provide a loop gain substantially of unity gain. When the phase change is zero, the output voltage increases progressively until the maximum voltage $V_{max}$ is reached. If the input phase changes, the output envelope voltage thereafter reduces progressively toward zero when the loop gain is unity. Thus, the envelope output can be a maximum voltage $V_{max}$ (e.g., 1 volt) if there is no phase change and substantially zero volts if there is a phase change during the regenerative period of the SRA.

The output voltage signal is then demodulated using a pseudo synchronous demodulator 1620. The pseudo synchronous demodulator 1620 retains the rectified envelope of the signal and can be, for example, an envelope detector, a mixer, a self-multiplier, a Gilbert cell mixer, a single or double alternating rectifier, a double balanced mixer, an active or passive mixer, or an emulated diode, resistor, current source and rectifier with bipolar NPN or PNP or CMOS P or N transistors or any other suitable type of self-demodulator that does not need an additional local oscillator signal. The pseudo synchronous demodulator 1620 rectifies the signal to provide only the positive voltage values, negative values, or a differential signal. The output is the rectified envelope of the signal.

For a pseudo synchronous demodulator, it is known that the product of two sinus functions of same frequency creates a term at double frequency and one at zero frequency. Filtering the double frequency term while keeping the zero frequency information provides demodulated information represented as a voltage proportional to the half (or rectified) envelope of the signal.

A low pass filter 1622 can be applied to remove the double frequency or other harmonics of the carrier frequency created by the demodulator rectifier, unwanted frequencies, wideband noise and any high frequency signals involved in the amplification provided by the SRA 1618.

An analog to digital converter 1624 is used to convert the voltage values to a bit stream corresponding to the information being transmitted. In particular, if the analog to digital converter 1624 samples at 10 times the symbol rate with N bits of resolution, a digital signal is created and provided to the transmit and receive baseband processing 1602 for further processing before output. Processing may include: Offsetting and scaling to a portion of a digital full scale, slicing the symbols with N levels, sampling the data, mapping the results to symbols, decoding, converting differential BPSK into non-differential BPSK, decoding forward error correction, etc.

In another implementation targeting very high speed data, the analog to digital converter 1624 vertical resolution may be reduced, which may result in one fast comparator rather than many comparators in parallel. The fast comparator provides a 1 bit resolution comparison "1" or "0", 1 being output when the signal is above a threshold level, and "0" otherwise. In this implementation, the analog to digital converter 1624 sampling rate can be reduced. For example, for a symbol rate of 5 GSymb/s the analog to digital converter 1624 would need to sample at 10 GSps or more. In some implementations, the sampling rate can be reduced to one times the symbol rate. If the SRA reset signal and the incoming data are made synchronous, the sampling rate may be reduced.

Since the SRA converted the BPSK phase difference information into voltage levels, the analog to digital converter 1624 is able to process voltage levels corresponding to either a phase change of 180 degrees (zero voltage) or $V_{max}$ corresponding to 0-degree phase change.

As an example, consider a BPSK binary stream "0,110, 001,101". By mapping a "0" to 0-deg phase and "1" to 180-deg phase, the input data stream "0,110,001,101" becomes a transmit modulated BPSK signal with the following sequence of phases: "0 deg, 180 deg, 180 deg, 0 deg, 0 deg, 0 deg, 180 deg, 180 deg, 0 deg, 180 deg". The SRA converts this stream of phase changes to "unknown, 0, $V_{max}$, 0, $V_{max}$, $V_{max}$, 0, $V_{max}$, 0, 0". The first state is unknown since a difference is needed. This is a common problem for differential modulations and an extra known bit may be added at the beginning of the stream to correct this. If the state is known prior to the sequence, then the extra known bit is unnecessary. After slicing around a threshold voltage centered between $V_{max}$ and zero, and recalling that a zero voltage is created when a 180-deg phase change happened, the SRA output stream after demodulation is "unknown, 1, 0, 1, 0, 0, 1, 0, 1, 1". Replacing the unknown bit by "0" gives "(0),101,001,011". In a differential to non-differential conversion a "1" equates to a change of state while a "0" to none. Thus, a value of "1" in the SRA output indicates that the binary value has changed from the previous value while an SRA output of "0" indicates a repeating of the last binary value. By this virtue, the differential to non-differential conversion provides "(0)110,001,101". By comparing this with the input data stream, one can observe that the incoming bit stream has been recovered correctly.

Figure 15:
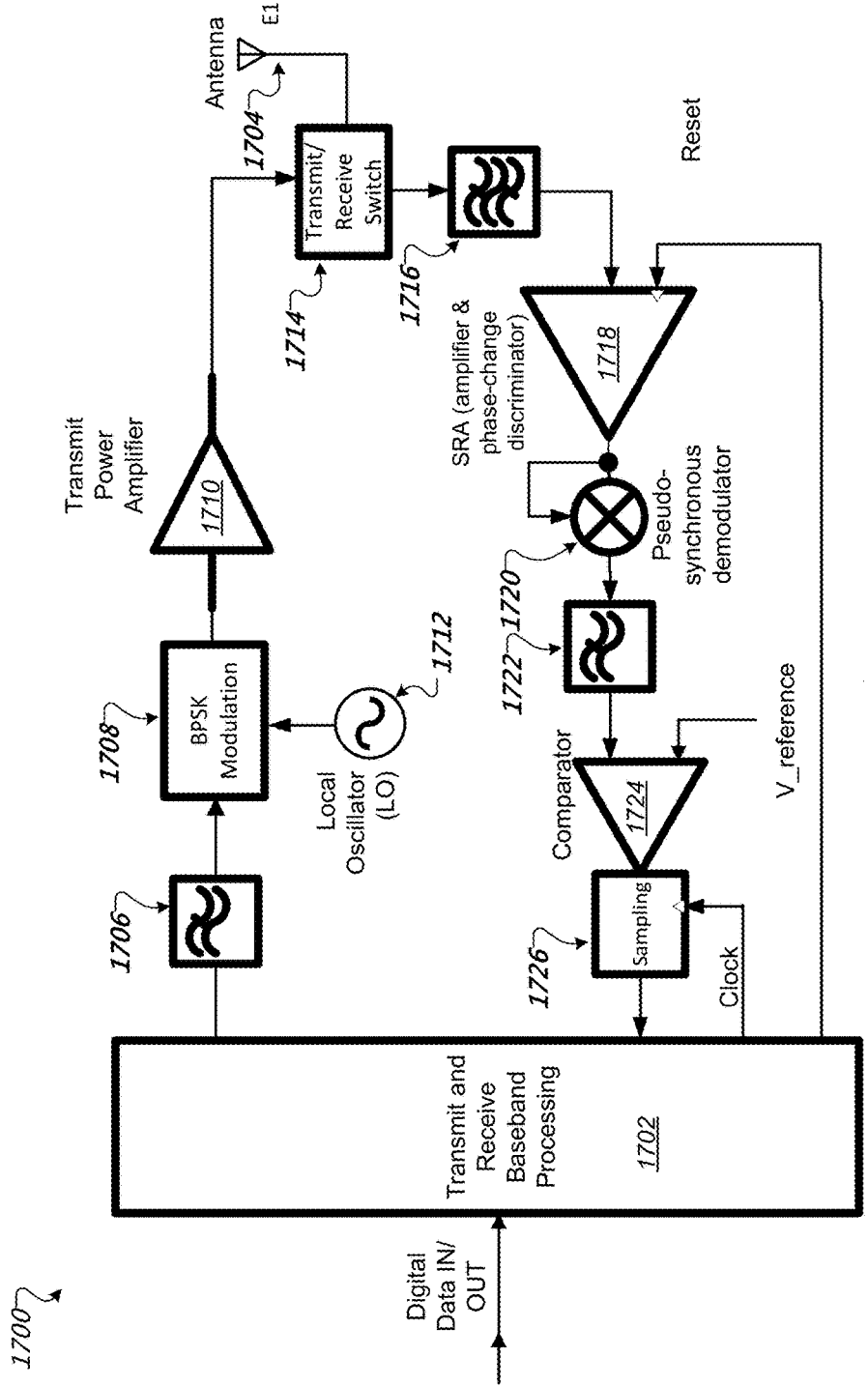
FIG. 15 is a block diagram of another example communication system including BPSK demodulation.

FIG. 15 is a block diagram of an example communication system 1700 including BPSK demodulation using one or more SRAs. In particular, the communication system 1700 can perform modulation and demodulation for EHF frequency transmissions. The communication system 1700 uses one or more SRAs 1718 to provide both amplification and phase change discrimination. As with FIG. 14, the symbol diagram for the SRA can correspond to a number of different SRA topologies including those described with respect to FIGS. 6A-D to FIG. 8. Additionally, in some implementations, the single SRA can be replaced by two interleaved SRAs, for example, as shown in FIGS. 11-13. The communication system 1700 does not require synchronous demodulation and consequently does not require a PLL, a LO, a Costas loop or a carrier extraction function to perform the demodulation.

The BPSK communication system 1700 is similar to the one of FIG. 14 with some differences. Thus, the common features with communication system 1600 may apply in BPSK communication system 1700. The main differences between communication systems 1600 and 1700 include: The transmit digital to analog converter 1606 is replaced by a 1-bit amplifier and the receive analog to digital converter 1624 is replaced by a 1 bit 2-levels comparator. For very high data rate, an analog low pass filter on the transmit path before the BPSK modulator may be included.

BPSK communication system 1700 includes both modulation and demodulation paths for data transmission and data reception, respectively. In this example, the transceiver may be used to both transmit and receive data depending on the mode of the transceiver. A single structure is shown for convenience, however, in some other implementations, the paths can be independent and associated with distinct antennas, e.g., of different IC packages, without changing the general functioning of the modulation and demodulation.

To transmit modulated data, incoming digital data can be initially received by transmit and receive baseband processing 1702, which manages RF functions for the communication system 1700. The baseband processing can include performing synchronization, tracking, digital processing, and encoding (and alternatively decoding of received data) of the unmodulated digital signal in a similar manner as described above with respect to transmit and receive baseband processing 302 (FIG. 3). After processing, the data is passed along the modulation path and the RF/EHF amplifier toward an antenna 1704. The antenna 1704 may then transmit the modulated signal.

The modulation path includes a low pass filter 1706 that may define a frequency bandwidth of the generated BPSK modulated signal. The low pass filter 1706 may limit the bandwidth of the modulated signal, therefore limiting the bandwidth of the transmitted signal. There is a communication relationship that links the signal frequency bandwidth (BW) and the rise and fall time $(t_{r,f})$ of the signal: $BW \times t_{r,f} \approx 0.35$. As an example, if the input signal is a binary bit stream of 50 GHz bandwidth with a 10 GSps symbol rate (S), and is modulated in BPSK, the minimum EHF bandwidth required to optimally demodulate a BPSK signal is 1.6×S which equals 16 GHz. In some cases, the bandwidth may be reduced to 1.0×S or less at the expense of reduced RF sensitivity or the creation of artifacts during demodulation due to the excess RMS delay spread or lack of bandwidth. Equalization and or pre-emphasis may be used to counter at least in part these impairments. The low pass filter 1706 may be designed to have a cutting frequency of 16 GHz. This impacts the rise and fall times of the digital modulating signal such that as $t_{r,f}$ is reduced from about 0.35/50 GHz=7 ps before the filter to 0.35/16 GHz=21.9 ps after the filter.

As with the communication system 1600 of FIG. 14, the output of the BPSK modulator 1708 is a modulated form of the carrier signal generated by the local oscillator 1712. The modulation can be performed such that each symbol of the input data corresponds to a particular phase of the carrier signal. In some implementations of the BPSK modulator 1708 is configured for high speed data transmission. An incoming bit stream signal may be either differential or single ended. If the incoming bit stream is single ended, it may be converted to a differential signal using conventional conversion techniques. The differential signal balances the current on both branches of a mixer structure such as a Gilbert Cell. The local oscillator (LO) signal 1712 is fed to the bottom of the mixer structure. For example, the sinewave of the LO signal may be provided to the output with no phase change or inversion. In this scenario, an incoming signal change creates a phase change and both signals are strictly related.

This technique provides a nearly constant current driving either branch of the circuit. This allows the BPSK modulator 1708 to be very fast while generating less noise than other techniques. Other techniques may exhibit dynamic instantaneous current changes that cause noise in the signal path, through the power supplies or EMI radiation.

On the other hand, nearly the same current is consumed for "1s" and for "0s". One aspect of BPSK is that at the phase transitions between 0 and 180 degrees, the envelope of the carrier amplitude may reach zero. Such phase transitions should be minimized to avoid EMC spikes and EMI radiation due to the instantaneous current variations.

Other BPSK modulator techniques such as single ended signal processing may be used to reduce the average consumed current with the potential drawbacks of reduced transition speed and reduced output bandwidth.

The resulting BPSK modulated output signal is amplified by amplifier 1710 to a specified transmit power and routed to the antenna 1704 for transmission. A transmit/receive switch 1714 can be used to select between the transmission or reception path to the antenna. In some implementations, the transmit/receive switch 1714 is not needed because transmission and reception are associated with dedicated antennas.

When the antenna 1704 receives a modulated signal from another device, the transmit/receive switch 1714 routes the signal along a demodulation path to extract the digital data from the modulated signal. A filter 1716 can be used to filter any signals outside of the particular expected frequencies of the received signal.

The filtered modulated signal then passes through an SRA 1718 configured as a phase change to voltage converter. Similar to the SRA 1618 and as described in detail in the previous sections, the SRA 1718 generates a maximum voltage (e.g., 1 Volt) if there is no phase change and zero Volts if there is a phase change.

The output voltage signal is then demodulated using a pseudo synchronous demodulator 1720. The pseudo synchronous demodulator 1720, similar to the pseudo synchronous demodulator 1620, rectifies the signal so that there is only a positive, a negative or a differential signal envelope. A filter 1722 can be applied to keep the signal envelope and remove the frequency components at the carrier frequency, double the carrier frequency, unwanted frequencies, noise and other signals involved in the amplification provided by the SRA 1718.

Figure 16:
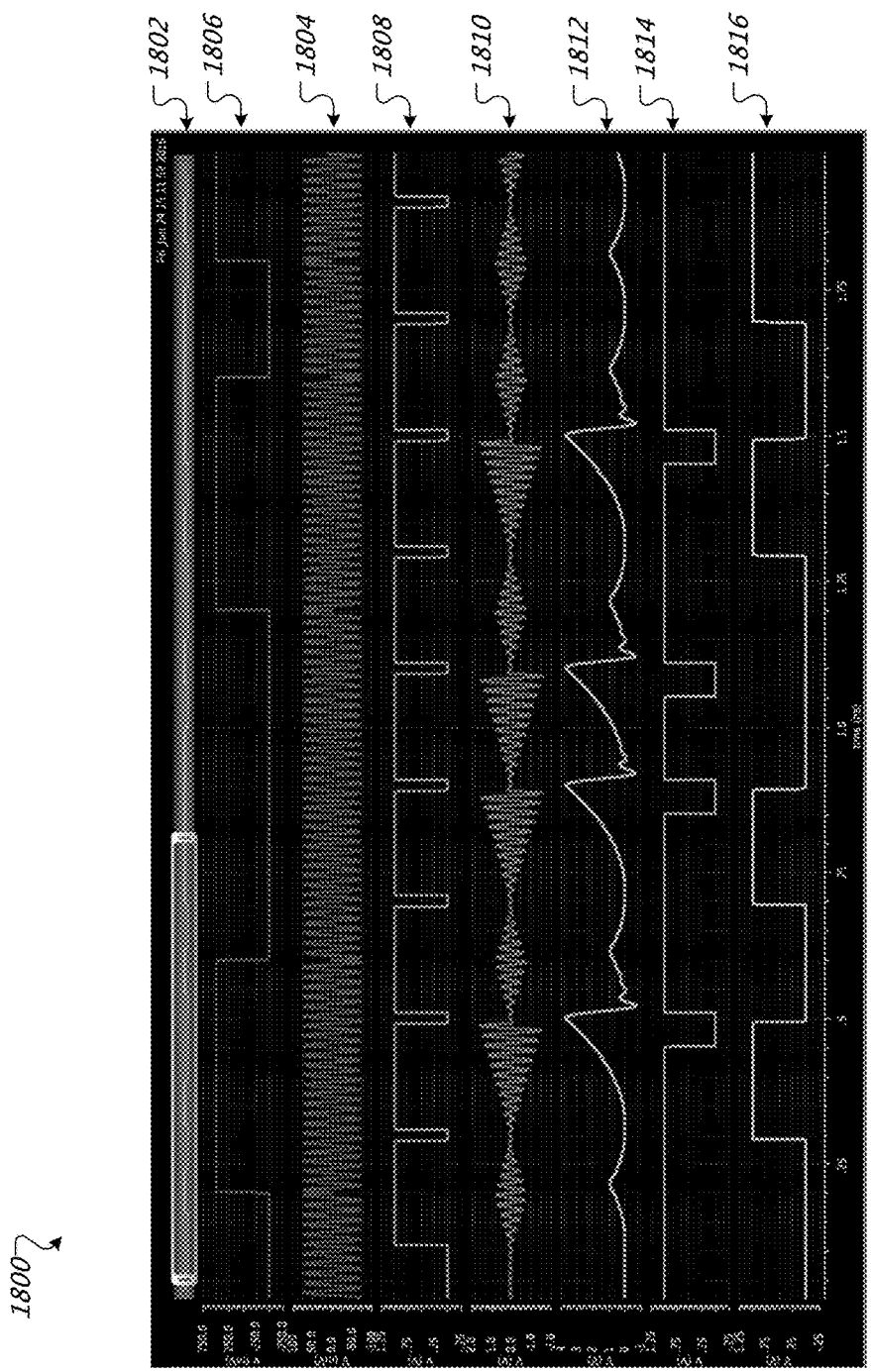
FIG. 16 shows the waveforms and the relative timings of various signals of an example implementation of the complete BPSK transceiver.

In contrast to the communication system 1600 of FIG. 16, the demodulation path does not include an N bit vertical resolution analog to digital converter 1624. Instead, the communication system 1700 includes a comparator 1724. The comparator 1724 is fed with the output from the pseudo synchronous demodulator 1720 and a reference voltage that is the threshold level that determine what is a zero (below it) or a "1" (above it).

The binary digital output from the comparator is sampled by sampler 1726 based on a clock signal. The clock is provided from the baseband processing block 1702 and, after the initial or cyclic synchronization process has been completed between the remote transmitter and the receiver, becomes synchronous in frequency and phase with the incoming symbol data stream. A typical implementation of such a function is a PLL locked to the symbol rate. As an example if the symbol rate is 20 Gbps, or 50 ps bit period for BPSK, the clock runs at 20 GSps and is synchronized with the incoming data stream to provide a maximum eye opening and/or a minimum BER. The inverted reset signal also runs at 20 GSps in this example and is synchronous with the clock signal. The reset signal can be derived from the clock signal in some implementations.

The sampling identifies the binary values for each symbol in order to generate a bit stream, which is provided to the transmit and receive baseband processing block 1702. Such processing may include: differential BPSK (DBPSK) to non-differential conversion, DBPSK to BPSK, decoding if previously encoded (e.g. NRZ), forward error correction FER extraction if FER was used, digital filtering, equalization, tracking, scaling, offset removal, link quality monitoring, RSSI monitoring, etc.

FIG. 16 shows a display 1800 of waveforms and relative timings of various signals of an example implementation of a BPSK transceiver as shown in FIG. 15.

In the display 1800, the input bit stream 1802 is shown at the top of the figure and corresponds to bit stream "0110001101". The other waveforms 1806 to 1816 are shown in a magnified time portion of the bit stream 1802. Additionally, in this example, the data rate or symbol rate is 5 Gbps or 200 ps bit time and the carrier frequency is chosen to be 60 GHz. The input signal corresponding to the input BPSK signal in FIG. 15 is modulated with a local oscillator at 60 GHz and shown by signal 1804. The changes of phases are shown at each 0-1 or 1-0 transitions in the bit stream 1806. In this example there is no filter 1706 and therefore the frequency bandwidth of the signal is not band limited.

The display 1800 also displays the inverted RESET signal 1808 for the SRA. The inverted reset signal is provided by the baseband processing function 1702 and adjusted accurately after the synchronization phase. The inverted RESET is delayed by 0.5-bit time so that the SRA identifies a phase change substantially in the middle of a regeneration period. The duty cycle of the inverted RESET is about 90% for regeneration and 10% for reset. The SRA output signal 1810 is also displayed. As shown by the output signal 1810, the regeneration process starts at the rising edge of the inverse RESET and stops as its falling edge. As described previously, the SRA's output envelope increases due to the progressive (coherent) amplification until half the regeneration process and either 1) continues to grow until $V_{max}$ when there is no phase change or 2) decreases to substantially zero when a 180-degrees change of phase happens.

The first SRA output shown in 1810 at the left of the window shows a pyramid shape output created by a change of phase illustrated by the input signal 1804. However, the next occurrence in the SRA output signal 1810 is a full regeneration that corresponds again to the portion of the input signal 1804 that shows no change of phase (0 degree). The SRA signal after pseudo synchronous demodulation and low pass filtering is shown by signal 1812, which corresponds to the rectification of the SRA output signal 1810 while keeping the envelope of the signal. A nonlinear effect is visible due to the non-linear transfer function of the pseudo-synchronous demodulator and the type of low pass filter. Also a delay may be noticeable due to the delay of the particular low pass filter used.

At the end of each regeneration (i.e., at the falling edge time of the inverse RESET signal 1808), the output voltage of the SRA in this example is either around 0 V or around 3.5 V, zero representing a 180 degrees' phase change and 3.5 V for no phase change. The output of the comparator is shown by signal 1814, for which the threshold voltage has been placed at about 2 V. The sampling time is set in this example to coincide with the falling edge of the inverse RESET signal. Finally, the signal after sampling is shown by signal 1816 and provides a "1" after a 0-degree phase change (SRA output envelope was about 3.5 V) and a "0" after a 180-degree phase change (SRA's output 1810 was about 0 V). As described previously, the output signal 1816 after sampling is the demodulated DBPSK and is "X101001011". As described above, the first bit X is invalid since the SRA provides a differential output information. After replacing this first bit by a "0" and converting this bit stream into a non-differential coding as described above, the resulting output provides a demodulated BPSK bit stream of value "(0)110001101" which is correct and corresponds to the incoming bit stream 1802.

In some implementations, the regeneration cycle of the SRA is made synchronous with the symbol rate, and the timing aligned such as the SRA regeneration cycle is centered around the time of input phase transition (inverse RESET signal is delayed by a value close to 0.5×symbol-time).

Variations of BPSK Communication System

In some other implementations, the SRA 1718 in FIG. 15 is followed by a Costas loop synchronous demodulation e.g., using a Costas loop similar to Costas loop 400 shown in FIG. 4. In this implementation, the timing of the SRA is changed such that the regeneration is in phase with the symbol signal (RESET signal is in phase with the symbol time). The output of the SRA is directly fed into the 2 mixers of the Costas loop (e.g., mixers 406 and 408 of FIG. 4) and the 2 low pass filtering is done afterwards. In this configuration, the RESET phase is aligned to the phase changes and the regeneration cycle is centered in the symbol-time. This concept is valid since the SRA passes-through the incoming signal phase when no phase change occurs in the regeneration time but not during the reset time. The output of the I-path mixer is followed by a low pass filter to remove the mixing product such as a frequency component at twice the carrier frequency and keep only the signal envelope (modulation sign, and phase error). The signal after filtering becomes $+V_{max}$ when both input frequency and LO (usually 0-degree phase)

are in phase at −90 degrees, and −$V_{max}$ when in counter phase (usually +90 degrees). The output is still a BPSK signal and not a DBPSK signal. An advantage of this implementation is that the energy per bit is doubled versus pseudo synchronous demodulation (−$V_{max}$ to +$V_{max}$ range as compared to 0 to $V_{max}$ range). However, at high frequency the implementation adds complexity and increases power consumption.

In yet another implementation, the SRA 1718 in FIG. 15 is followed by a synchronous demodulation where the local oscillator is using carrier extraction. The SRA is followed by a mixer fed on its second terminal with the synchronous local oscillator. A synchronous local oscillator can be generated by carrier extraction as shown in FIG. 5. In this scenario, the timing of the SRA is set such that the regeneration is in phase with the symbol signal (RESET signal is in phase with the symbol time). The output of the mixer is followed by a low pass filter to remove the mixing product such as frequency component at twice the carrier frequency and keep only the signal envelope. The signal after filtering is +$V_{max}$ with both input frequency and local oscillator (usually 0-degree phase) are in phase and −$V_{max}$ when in counter phase (usually 180 degrees). The output is still a BPSK signal and not a DBPSK signal. An advantage of this implementation is that the energy per bit is doubled versus pseudo synchronous demodulation (−$V_{max}$ to +$V_{max}$ as compared to 0 to $V_{max}$). However, the implementation at high frequency adds complexity and increases power consumption, e.g., power consumption can be 2 to 15 times greater.

BPSK Demodulation Using Two Interleaved SRAs

Referring back to FIGS. 14 and 15, the SRAs 1618 and 1718, respectively, can each represent two interleaved SRAs, for example as described with respect to FIGS. 11-13. In the interleaved SRA's of FIGS. 11-13 the regeneration cycle is made synchronous with half the symbol rate (2 symbols long) to give more time to the SRA(s) to regenerate and discriminate the phase change(s), which may be particularly useful when the ratio of the carrier frequency and the symbol rate is less than around 25, when the carrier frequency is high (e.g. range of 1 GHz to 2000 GHz), or when the data rate is high (e.g., a range of 100 Mbps to 1000 Gbps). This implementation uses two SRAs in parallel, each regenerating on two symbols long and interleaved between each other with the RESET signal. As described with respect to FIGS. 11-13, this implementation is more complex but has the advantage of providing more time (double symbol time) to regenerate as compared to single SRA implementations.

Figure 17:
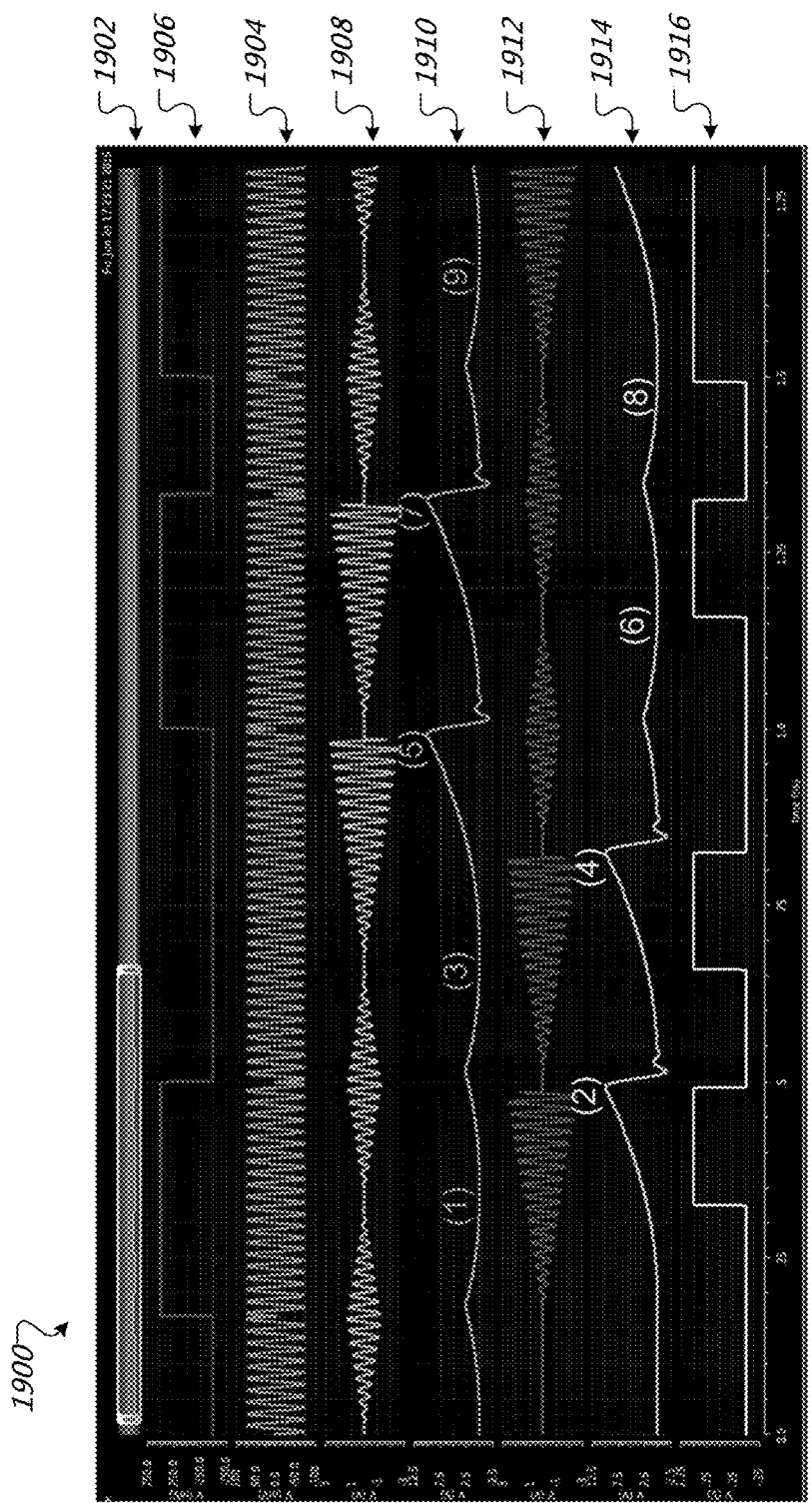
FIG. 17 shows the waveforms and the relative timings of various signals of an example implementation of the complete BPSK transceiver using interleaved SRAs.

FIG. 17 shows a display 1900 of the waveforms and the relative timings of various signals of an example implementation of the complete BPSK transceiver regenerated over two symbols using two interleaved SRAs. The SRAs can be interleaved SRAs, for example, as described in FIGS. 11-13. Specifically, the transceiver can use two parallel interleaved half rate SRAs as phase discriminators. Particular signals are plotted including the digital input stream, modulated to EHF, transmitted, received, amplified, discriminated, demodulated, sliced and output.

In the display 1900, the input bit stream 1902 is shown on top of the display 1900 and in this example corresponds to bits "0110001101". The other waveforms 1906 to 1916 are shown in a magnified time portion of the bit stream 1902. Additionally, in this example, the data rate or symbol rate is 6 Gbps or 166.7 ps bit time and the carrier frequency is chosen to be 60 GHz. The input signal, e.g., corresponding to the input BPSK signal in FIG. 15, is modulated with a local oscillator at 60 GHz and shown by signal 1904. The changes of phases are shown at each 0-1 or 1-0 transitions in the bit stream 1906. In this example there is no filter 1706 and therefore the frequency bandwidth of the signal is not band limited for more visual clarity.

The inverted reset signal for the SRA is not shown but is synchronous with the incoming data stream for the first SRA and is delayed by one symbol-time for the second SRA of the interleaved SRAs. The reset signal is provided by the processing function 1702 and adjusted accurately after the synchronization phase. In this example the reset signal's duty cycle is 10% reset, 90% regenerate.

The output of the first SRA is shown by signal 1908. Signal 1908 illustrates that the SRA signal has a full regeneration that lasts 2 symbol-times. As described above, a change of phase creates a "pyramid" envelope shaped signal where the amplification of the signal increases and then decreases, whereas no phase change creates a full regeneration until the falling edge of the inverted RESET signal.

The first SRA signal after pseudo synchronous demodulation and low pass filtering is shown by signal 1910. The signal 1910 corresponds to the rectification of the SRA output signal 1908 for the first SRA and keeps the envelope of the signal. A nonlinear effect is visible due to the non-linear transfer function of the pseudo-synchronous demodulator (a self-multiplier in this example) and low pass filter. Also a delay is noticeable due to the group delay of the particular low pass filter used, in this example a Butterworth low pass filter of 7th order with cut frequency of 40 GHz.

The output of the second SRA is shown by signal 1912. The output of the second SRA 1304 illustrates the delay of 1 symbol 1308 shown in FIG. 11 versus the output of the first SRA as 1302 shown in FIG. 11. The second SRA signal after pseudo synchronous demodulation and low pass filtering is shown by signal 1914. The non-linear effect and delay are similar to that of the signal 1910.

At the end of each regeneration that is A) at the top of the positive ramps identified at (2), (4), (5), (7) or B) at the end of the negative ramp close to zero identified at (1), (3), (6), (8), (9) the output voltage of each SRA in this example is either around 0V or around 10V, zero representing a 180 degree phase change and 10V representing a phase change of zero degrees. In some implementations, the end of the regeneration process of the first SRA 1908 and 1302 in FIG. 11 coincides with the falling edge time of the inverse reset signal and the end of the regeneration process of the second SRA 1912 and 1304 in FIG. 11 coincides with the inverse reset delayed by one symbol as provided by 1308 in FIG. 11. Two similar comparators follow the outputs of demodulation shown by 1910 and 1914 for which the threshold voltage or reference voltage may be set around the mid-level between 0 and $V_{max}$, in the example between 0 V and 10 V, e.g. 5 V.

Finally, both signals are sampled at times (1) to (9), and selected alternatively to create the output stream 1916 from signals 1910 and 1914 at times (1), (2), (3), (4), (5), (6), (7), (8), and (9) which outputs the following:

Undefined=X before (1),
0 V or 180 degrees="1" at (1),
10 V or 0 degrees="0" at (2),
0 V or 180 degrees="1" at (3),
10 V or 0 degrees="0" at (4),
10 V or 0 degrees="0" at (5),
0 V or 180 degrees="1" at (6),
10 V or 0 degrees="0" at (7),
0 V or 180 degrees="1" at (8), and
0 V or 180 degrees="1" at (9).

The resulting bit stream is "X101001011". It is sampled and output as output stream 1916 to the transmit/receiver baseband processing.

To convert this differential data stream to a non-differential one, the same conversion described above is applied and the bit stream becomes "(0)110001101". This demodulated digital output is identical to the incoming data stream.

A number of embodiments of the invention have been described. Nevertheless, it will be understood that various modifications may be made without departing from the spirit and scope of the invention. Accordingly, other embodiments are within the scope of the following claims.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An apparatus comprising:
   a first super-regenerative amplifier (SRA) and a second SRA, each configured to receive a phase shift keying (PSK) modulated signal and output an amplitude signal indicative of changes in phase of the PSK modulated signal;
   a first pseudo synchronous demodulator configured to process an output of the first SRA to generate a first demodulated signal;
   a second pseudo synchronous demodulator configured to process an output of the second SRA to generate a second demodulated signal;
   a first analog to digital converter (ADC) configured to convert values of the first demodulated signal to digital binary values; and
   a second ADC configured to convert values of the second demodulated signal to digital binary values,
   wherein the outputs of the first and second ADCs are selectively combined to generate an interleaved output.

2. The apparatus of claim 1, wherein the amplitude signal output by the second SRA is delayed with respect to the amplitude signal output by the first SRA.

3. The apparatus of claim 1, wherein the PSK modulated signal is a differential PSK modulated signal.

4. The apparatus of claim 1, wherein to process SRA output signals of the first and second SRAs includes rectifying the two SRA output signals and generating envelopes of the rectified SRA output signals as the demodulated signals.

5. The apparatus of claim 1, further comprising a first low pass filter coupled between the first pseudo synchronous demodulator and the first ADC, and a second low pass filter coupled between the second pseudo synchronous demodulator and the second ADC.

6. The apparatus of claim 1, wherein the first SRA amplifies the PSK modulated signal to a maximum amplitude to indicate no change in phase of the PSK modulated signal.

7. The apparatus of claim 1, wherein amplification by the first SRA approaches zero amplitude to indicate a change in phase of the PSK modulated signal.

8. The apparatus of claim 1, wherein the first ADC compares amplitude values of the demodulated signal to a threshold such that amplitude values above the threshold are assigned a first value and amplitude values below the threshold are assigned a second value.

9. The apparatus of claim 1, wherein the amplitude signal refers to a measure of one or more of voltage, current, power, frequency, phase, or temperature.

10. The apparatus of claim 1, wherein the first SRA comprises an adder coupled to an input line of the first SRA, to a first end of a delay line, and to an input of an amplifier, wherein the first SRA further comprises a reset switch positioned between the output of the amplifier and an output of the first SRA, and wherein the output of the amplifier is routed to a second end of the delay line and to the output of the first SRA.

11. The apparatus of claim 1, wherein the first SRA comprises an adder coupled to an input line of the first SRA, to a first end of a delay line, and to an input of an amplifier, wherein the first SRA further comprises a reset switch positioned between the first end of the delay line and the adder, and wherein the output of the amplifier is routed to a second end of the delay line and to an output of the first SRA.

12. The apparatus of claim 1, wherein the first SRA comprises an adder coupled to an input line of the first SRA, to a first end of a delay loop, and to an input of an amplifier, wherein the first SRA further comprises, a reset switch positioned between an output of the amplifier and an output of the first SRA, wherein an output of the amplifier is coupled to a second end of the delay loop, and wherein the delay loop includes a delay line and an inverter.

13. The apparatus of claim 1, wherein the first SRA comprises an adder coupled to an input line of the first SRA, to a first end of a delay loop, and to an input of an amplifier, wherein an output of the amplifier is coupled to a second end of the delay loop, and wherein the delay loop includes an inverter coupled to a delay line and the delay line coupled to a reset switch.

14. The apparatus of claim 1, wherein the first SRA comprises a subtractor coupled to an input line of the first SRA, to a first end of a delay line, and to an input of an amplifier, wherein the delay line includes a reset switch, and wherein the delay line provides a 180-degree delay.

15. The apparatus of claim 1, wherein the first SRA is a single ended amplifier, the first SRA including an adder coupled to an input line of the first SRA, to a first end of at least one fixed or virtual delay line, to an output of an oscillator amplifier, and to a resonator circuit, wherein the oscillator amplifier is coupled to a second end of the at least one fixed or virtual delay line, and wherein the adder is further coupled to an output of the first SRA.

16. The apparatus of claim 1, wherein the first SRA is differential, the first SRA including:

a first adder coupled to a first input line of the first SRA, to a first fixed or virtual delay line, to an oscillator amplifier, and to a resonator circuit, and a second adder coupled to a second input line of the first SRA, to a second fixed or virtual delay line, to the oscillator amplifier, and to the resonator circuit, wherein the first SRA generates a differential phase to amplitude conversion.

17. The apparatus of claim 1, wherein each of the first SRA and second SRA is configured to regenerate over a double symbol length of time and wherein each SRA has a half symbol rate interleaved timing.

18. The apparatus of claim 1, wherein a reset signal of the second SRA is delayed by one symbol with respect to a reset signal of the first SRA.

19. The apparatus of claim 1, wherein the first SRA includes a reset switch that is triggered by a cyclical reset signal.

20. The apparatus of claim 19, wherein the reset signal is synchronized in phase with incoming symbols.

* * * * *